United States Patent [19]
Motooka et al.

[11] Patent Number: 5,831,441
[45] Date of Patent: Nov. 3, 1998

[54] TEST BOARD FOR TESTING A SEMICONDUCTOR DEVICE, METHOD OF TESTING THE SEMICONDUCTOR DEVICE, CONTACT DEVICE, TEST METHOD USING THE CONTACT DEVICE, AND TEST JIG FOR TESTING THE SEMICONDUCTOR DEVICE

[75] Inventors: Toshiyuki Motooka, Kawasaki; Syuichirou Takahasi, Taketa; Tatsuharu Matsuda; Kunio Kodama, both of Kawasaki; Joji Fujimori, Kawasaki; Shigeki Harada, Kawasaki; Masataka Mizukoshi, Kawasaki; Masashi Takenaka, Kawasaki; Tatsuro Yamashita, Satsuma-gun, all of Japan

[73] Assignee: Fujitsu Limited, Kanagawa, Japan

[21] Appl. No.: 612,750

[22] Filed: Mar. 8, 1996

Related U.S. Application Data

[63] Continuation-in-part of Ser. No. 531,449, Sep. 21, 1995.

[30] Foreign Application Priority Data

Jun. 30, 1995 [JP] Japan .................................. 7-166292
Nov. 17, 1995 [JP] Japan .................................. 7-300166

[51] Int. Cl.⁶ .................................................. G01R 31/02
[52] U.S. Cl. .......................... 324/754; 324/757; 324/765
[58] Field of Search ................................... 324/754, 765, 324/757; 438/18; 29/840, 877; 257/41, 48

[56] References Cited

U.S. PATENT DOCUMENTS

| | | | |
|---|---|---|---|
| 5,326,428 | 7/1994 | Farnworth et al. | 156/654.1 |
| 5,374,893 | 12/1994 | Koopman et al. | 324/754 |
| 5,604,445 | 2/1997 | Desai et al. | 324/755 |
| 5,634,267 | 6/1997 | Farnworth et al. | 29/840 |

OTHER PUBLICATIONS

Yuichi Nakamura, "Bare–chip burn–in test system," Electronics fabricating technology in Japanese, vol.11 No.4, pp.27–31, (1995) (month unavailable).

Randal Reebuck, et al., "Performance Testing of a Non–Destructive Burn–In Interconnect system for Known Good Die, DieMate," Texas Instruments Technical Library, 1994 (Oct.).

*Primary Examiner*—Vinh P. Nguyen
*Assistant Examiner*—Russell M. Kobert
*Attorney, Agent, or Firm*—Armstrong, Westerman, Hattori, McLeland & Naughton

[57] ABSTRACT

A test board used for testing a semiconductor device provided with projection electrodes includes a main board and testing electrodes. The testing electrodes are provided on the main board, each projecting upwardly from the main board. When the semiconductor device is tested, the testing electrodes are electrically connected to the projection electrodes by insertion of the testing electrodes into the projection electrodes. The semiconductor device is mounted on the main board to test the semiconductor device through the testing electrodes.

2 Claims, 28 Drawing Sheets

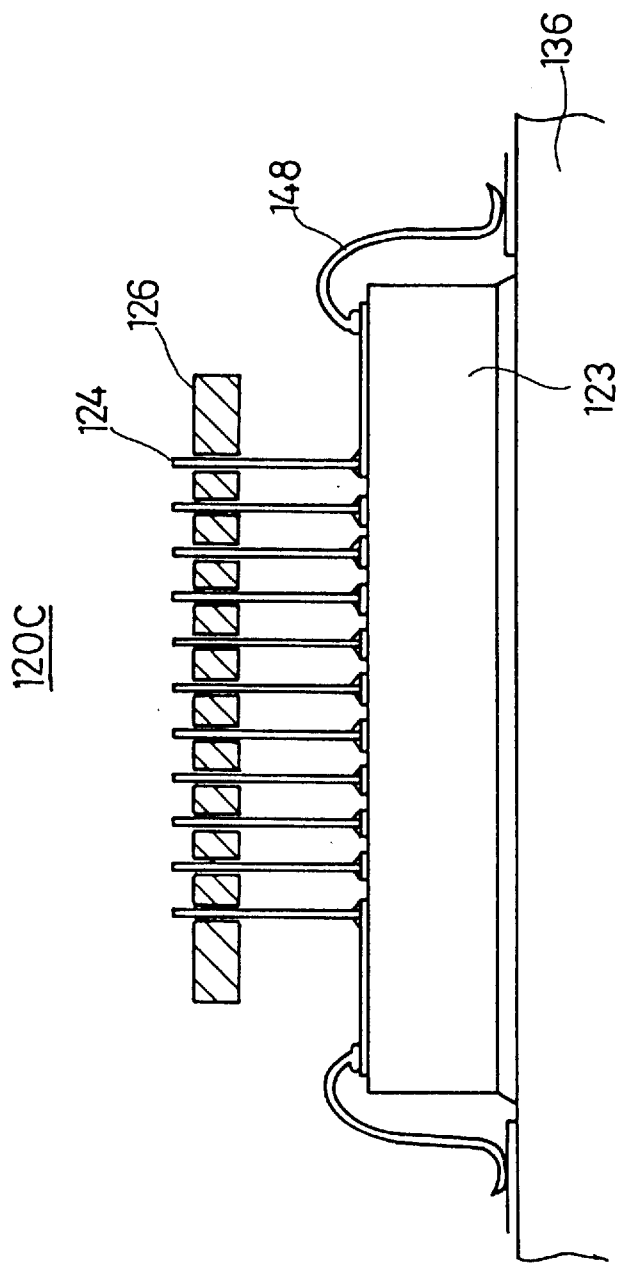

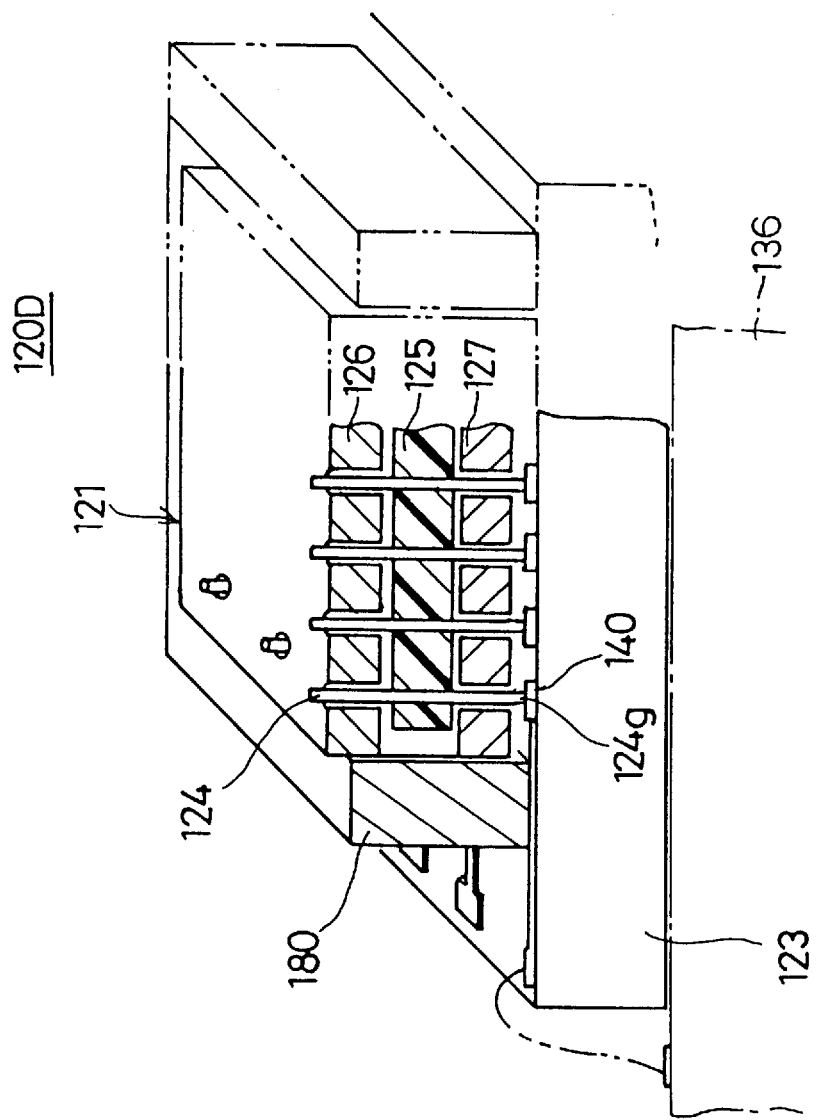

TEST BOARD FOR TESTING A SEMICONDUCTOR DEVICE, METHOD OF TESTING THE SEMICONDUCTOR DEVICE, CONTACT DEVICE, TEST METHOD USING THE CONTACT DEVICE, AND TEST JIG FOR TESTING THE SEMICONDUCTOR DEVICE

This application is a continuation-in-part of application Ser. No. 08/531,449, filed Sep. 21, 1995, now pending.

BACKGROUND OF THE INVENTION

1. Field of the Invention

The present invention generally relates to a test board for testing a semiconductor device, a method of testing the semiconductor device, a contact-probe device, a test method using the contact-probe device, and a test jig for testing the semiconductor device, and more particularly, to a test board for testing a semiconductor device, a method of testing the semiconductor device, a contact-probe device, a test method using the contact-probe device, and a test jig for testing the semiconductor device which are suitably used for a test of a semiconductor device having projection electrodes.

Recently, in semiconductor devices, high-density integration, high-speed operation, and miniaturization are required. To meet the requirements, a method of directly mounting a plurality of bare chips (semiconductor chips which are not sealed within a package) on a circuit board is being widely used. For example, by the method, a multichip module is constructed.

In the method of mounting the plurality of bare chips, if a problem occurs in one of the plurality of bare chips mounted in the multichip module, the whole multichip module is rejected. Therefore, for each bare chip, a high level of reliability is required.

Accordingly, it is important to examine whether or not each bare chip operates properly.

2. Description of the Related Art

A variety of methods of testing a semiconductor device having projection electrodes are currently proposed and used. Herein, the bare chip and the semiconductor device sealed by plastic are wholly referred to as the semiconductor device. In the following, typical methods will be described.

A first conventional method is a testing method using a probe (which is referred to as a probe testing method, hereinafter). In the probe testing method, a plurality of probes are arranged on a test board according to the projection electrodes formed on the semiconductor device, and a test is carried out by directly contacting a top end of the probe with the projection electrode.

A second conventional method will be discussed by referring to FIG. 1. FIG. 1 shows an illustration for explaining the second conventional testing method for the semiconductor device. In the testing method shown in FIG. 1, projection electrodes 2 (which are referred to as solder bumps, hereinafter) formed on a semiconductor device 1 are soldered to testing electrodes 4 formed on a test board 3. In this way, the solder bumps 2 and the testing electrodes 4 are electrically connected to each other, and the semiconductor device 1 is tested. This testing method is referred to as a mount testing method, hereinafter. In this manner, as in a configuration where the semiconductor device 1 is mounted on the test board 3, the test is conducted.

A third conventional method will be discussed by referring to FIG. 2. FIG. 2 shows an illustration for explaining the third conventional testing method of the semiconductor device. In the testing method shown in FIG. 2, the semiconductor device 1 is pressed to the testing electrodes 4 formed on the test board 3 by using a fixed jig 5. By the pressure, the solder bumps 2 and the testing electrodes 4 are electrically connected, and the semiconductor device is tested. This testing method is referred to as a press testing method, hereinafter. In the press testing method, the solder bumps 2 are not melted, instead, the solder bumps 2 and the testing electrodes 4 are electrically connected by mechanical pressure with the fixed jig 5.

The fixed jig 5 is constructed with a pressing plate 6 in contact with the semiconductor device 1, a bolt 7 penetrating through both the pressing plate 6 and the test board 3, and a nut 8 located on a rear side of the test board 3, etc. By screwing the bolt 7 to the nut 8, the semiconductor device 1 with the pressing plate 6 is pressed to the test board 3.

A fourth conventional method will be discussed by referring to FIG. 3. FIG. 3 shows an illustration for explaining the fourth conventional testing method of the semiconductor device. In the testing method shown in FIG. 3, conductive resin 9 is arranged on the testing electrodes 4 formed on the test board 3, and with the conductive resin 9, the solder bumps 2 and the testing electrodes 4 are electrically connected to test the semiconductor device. This testing method is referred to as a conductive-resin testing method, hereinafter. The conductive resin 9 may be made of, for example, elastic resin in which conductive metal powder is included. The conductive resin 9 has a conductivity in only a pressing direction.

Further, a fifth conventional method will be discussed by referring to FIG. 4. FIG. 4 shows an illustration for explaining the fifth conventional testing method of the semiconductor device. The testing method shown in FIG. 4 is applied to the semiconductor device 1 having gold bumps 10. In the method, insulating resin 11 having thermal contractibility is injected into gaps between the semiconductor device 1 and the test board 3. This testing method is referred to as a thermal contraction testing method, hereinafter. In the thermal contraction testing method, the insulating resin 11 is injected into the gaps between the semiconductor device 1 and the test board 3, and the insulating resin 11 is contracted by heat. By the contraction, the semiconductor device 1 and the test board 3 are close to each other. At this time, the gold bumps 10 are sandwiched between the semiconductor device 1 and the test board 3, and, thus, the gold bumps 10 are pressed and electrically connected to the testing electrodes 4.

Furthermore, FIG. 5 shows a configuration example of a prior-art contact-probe device. A numeral "111" indicates a body of a testing apparatus connected with a contact-probe device 110, and a numeral "112" indicates a semiconductor chip 112. The contact-probe device 110 is a so called probe card, and is constructed with a disc-shaped board 113 and a plurality of long pins 114. Bottom ends of the long pins 114 are arranged corresponding to an arrangement of electrodes 115 of the semiconductor chip 112, and are fixed in a slanting and radiating form.

When characteristics of the semiconductor chip 112 are tested, as shown in FIG. 5, the bottom end of each pin 114 is contacted with the corresponding electrode 115 of the semiconductor chip 112.

Next, disadvantages in the above-mentioned conventional testing methods and contact-probe device will be described.

In the probe testing method, when the pitch arrangement of the solder bumps becomes narrow as semiconductor elements are integrated with high density, the probe needs to be thinner. Also, for positioning the respective probes, a high level of accuracy is required. However, there are limitations on thinning the probe and for obtaining highly accurate positioning of the probes. Therefore, the probe testing method is not suitable for testing of the highly integrated semiconductor elements.

In the mount testing method, since the solder bumps 2 are soldered to the testing electrodes 4 formed on the test board 3, the solder bumps 2 need to be disconnected from the testing electrodes 4 when the test is finished. Therefore, in this method, both a heating process and melting process are carried out for soldering and disconnecting the solder bumps 2, and, thus, the solder bumps 2 may be damaged. Further, when the solder bumps 2 are disconnected form the testing electrodes 4, impurities may be mixed with the solder bumps 2, and a portion of the solder bump 2 may remain in the testing electrode 4. Therefore, the reliability of the solder bumps 2 may be degraded.

In the press testing method, since extremely high pressure is required for electrically connecting the respective solder bumps 2 and the respective testing electrodes 4 to each other, there is a problem that the solder bumps 2 and the testing electrodes 4 may be bent or broken by the high pressure. Further, when the highly-integrated semiconductor device 1 has a large number of solder bumps 2, an increased pressure is required for pressing the whole semiconductor device 1 to the test board 3. There is, thus, a problem that the fixed jig 5 becomes larger in size.

In the conductive-resin testing method, when the semiconductor device 1 is separated from the test board 3 after the test is finished, the conductive resin 9 may remain in the solder bumps 2. If the conductive resin 9 remains in the solder bumps 2, the conductive resin 9 may be mixed into the solder when the solder bumps 2 are melted to fabricate the semiconductor device 1. There is thus a problem that reliability of the solder bumps 2 may be degraded. Further, since a resistance of the conductive resin 9 becomes relatively high when the conductive resin 9 is connected, there is a problem in that accuracy of the test may be degraded.

Further, in the thermal contraction testing method, when the semiconductor device 1 is separated from the test board 3 after the test is finished, the insulating resin 11 may remain in the semiconductor device 1. Therefore, reliability of the gold bumps 10 may be degraded. Further, since the insulating resin 11 is arranged over all places between the semiconductor device 1 and the test board 3, it is not easy to separate the semiconductor device 1 from the test board 3. There is, thus, a problem in that operation efficiency may be degraded.

As mentioned above, in the conventional testing methods, there are problems in that reliability of the bumps and test efficiency may be degraded.

Further, since in the prior-art contact-probe device 110 shown in FIG. 5, the pins 114 are arranged in the slanting and radiating form, a length L1 of the pin 114 is relatively long, for example, tens of millimeters. Therefore, when a signal frequency increases, inductance of the pin 114 also increases and becomes no longer negligible. By the inductance, the characteristics test of the semiconductor chip 112 may be influenced.

In addition, since the pins 114 are arranged in the slanting form and the lengths of the pins 114 are relatively long, it is difficult to precisely arrange positions of the bottom ends of the pins 114. Therefore, for manufacturing the contact-probe device 110 with high precision, product cost of the contact-probe device 110 increases.

Still further, since the pins 114 are arranged in the slanting form and the length of the pins 114 are relatively long, if a small force is applied to the bottom ends of the pins 114, a pitch of the top ends is shifted. Therefore, when the pins 114 are contacted with the electrodes 115 of the semiconductor chip 112 to carry out the characteristics test, a portion of the pins 114 may be outside of the electrodes 115 and may not be contacted with the electrodes 115. As a result, the test may not be carried out.

SUMMARY OF THE INVENTION

It is an object of the present invention to provide a test board for testing a semiconductor device, a method of testing the semiconductor device, a contact-probe device, a test method using the contact-probe device, and a test jig for testing the semiconductor device, which improve reliability of projection electrodes and test efficiency, in which the disadvantages described above are eliminated.

The object described above is achieved by a test board for testing a semiconductor device provided with projection electrodes, the test board comprising: a main board; and testing electrodes provided on the main board, each projecting upward from the main board; wherein the testing electrodes are electrically connected to the projection electrodes by insertion of the testing electrodes into the projection electrodes and the semiconductor device is mounted on the main board to test the semiconductor device through the testing electrodes.

According to the above test board, the testing electrodes are thrust into the projection electrodes. Therefore, it is ensured that the testing electrodes are electrically connected to the projection electrodes. Without an external mechanical pressure, the semiconductor device may be positively mounted to the main board. Therefore, it prevents the testing electrodes and the projection electrodes from being changed in shape and damaged. Further, when an oxide film is formed on a surface of the projection electrode, the testing electrode penetrates through the oxide film to be connected to the projection electrode. Therefore, a positive electrical connection between the testing electrodes and the projection electrodes is provided.

Further, when the testing electrodes are thrust into the projection electrodes, it is not necessary to apply heat. Therefore, under a normal temperature, a positive electrical connection between the testing electrodes and the projection electrodes is provided. Accordingly, it prevents the projection electrodes from being damaged by heat.

Furthermore, when the testing electrodes and the projection electrodes are electrically connected to each other, it becomes unnecessary to provide other conductive material between the testing electrodes and the projection electrodes, or between the semiconductor device and the main board. Therefore, reliability of the projection electrodes may be improved.

The object described above is also achieved by the test board mentioned above, wherein the testing electrodes are formed of a material comprising a base material and an additive, the material of the testing electrodes fails to produce a metallic compound upon reaction with the projection electrodes.

The object described above is also achieved by the test board mentioned above, wherein the base material comprises one of gold (Au) and palladium (Pd).

According to the above test board, an additive is added to the base material of the testing electrode. Therefore, the material of the testing electrodes will not produce a metallic compound including an alloy by reacting with the projection electrodes even under a usage temperature of a burn-in process. Accordingly, it prevents the projection electrodes from being damaged.

The object described above is also achieved by the test board mentioned above, wherein each of the testing electrodes comprises a covering film covering the testing electrodes, and the covering film is a material which fails to produce a metallic compound upon reaction with the projection electrodes.

The object described above is also achieved by the test board mentioned above, wherein the material of the covering film comprises nickel (Ni).

According to the above test board, the testing electrode is covered by the covering film which is made of the material which does not produce the metallic compound including an alloy as it does not react with the projection electrodes. The covering film prevents the material of the testing electrodes from being mixed into the projection electrodes. Therefore, the degradation of the projection electrodes may be prevented.

The object described above is also achieved by the test board mentioned above, wherein the testing electrodes comprise at least one wire bump.

According to the above test board, the testing electrodes are constructed with the wire bumps. The wire bumps can be formed by a conventional wire bonding apparatus used in a semiconductor-device manufacturing process. In this case, a height of the wire bump can be flexibly adjusted. Therefore, the testing electrodes may be formed with high efficiency and low cost.

The object described above is also achieved by the test board mentioned above, wherein the testing electrodes have different heights from a surface of the main board.

According to the test board, for the testing electrodes corresponding to the projection electrodes which do not need to be tested, the heights of the testing electrodes are adjusted lower so as to not be electrically connected to the projection electrodes. For the testing electrodes corresponding to the projection electrodes which need to be tested, the height of the testing electrodes is adjusted higher so as to be electrically connected to the projection electrodes. Namely, the projection electrodes to be tested may be selectively tested. Therefore, specified projection electrodes which do not need to be tested are prevented from being unnecessarily changed in shape by the testing electrodes being inserted.

The object described above is also achieved by the test board mentioned above, wherein the testing electrodes are harder than the projection electrodes.

According to the above test board, this prevents the testing electrodes from being changed in shape. Therefore, the test board may be used repeatedly. It is unnecessary to adjust the testing electrodes of the test board for each test.

The object described above is also achieved by the test board mentioned above, wherein each of the testing electrodes comprises a pedestal part having a predetermined bottom area, and a projection part extending upwardly from the pedestal part and having a cross-sectional area less than the bottom area of the pedestal part.

According to the above test board, since the pedestal part having a relatively wide bottom area is connected to the main board, the testing electrodes may be positively fixed to the main board. Since the projection part having the cross-sectional area narrower than the bottom area of the pedestal part is inserted into the projection electrode, this ensures that the projection part is easily inserted into the projection electrode.

The object described above is also achieved by a method of testing a semiconductor device on which projection electrodes are formed, the method using a test board having a main board and testing electrodes formed on the main board, each projecting upwardly from the main board, the method comprising the steps of: (a) mounting the semiconductor device on the main board of the test board by inserting the testing electrodes into the projection electrodes, wherein the testing electrodes are electrically connected to the projection electrodes; (b) testing the semiconductor device by using the testing electrodes connected to the projection electrodes; and (c) separating the semiconductor device from the test board.

According to the above method, by using the above-mentioned test board, under normal temperature, the semiconductor device is mounted on the main board of the test board so that the testing electrodes are electrically connected to the projection electrodes. After the test is finished, under normal temperature condition, the semiconductor device may be easily separated from the test board.

Therefore, in the step (a) of mounting the semiconductor device on the test board, no impurities are mixed into the projection electrodes. Accordingly, in the following step (b) of testing, a highly accurate test may be performed. Further, since the heating process is not necessary, the testing apparatus may be simplified.

In the step (c) of separating, since the semiconductor device is mounted on the test board by only inserting the testing electrodes into the projection electrodes, the semiconductor device may be separated from the test board by only pulling the semiconductor device from the test board. In this case, the heating process is not necessary and degradation of the projection electrodes may be prevented.

The object described above is also achieved by the method mentioned above, wherein the method further comprises a wet-back process of shaping the projection electrodes subsequent to the step (c).

According to the above method, since the wet-back process of shaping the projection electrodes formed on the semiconductor device is carried out after the step (c) is finished, the projection electrodes may be properly shaped.

When the projection electrode are formed by a plating method, voids may be generated within the projection electrode when solder is plated. The projection electrode in which the void is generated has a changed shape as compared to a normal projection electrode in which no void is generated. Therefore, to remove the void and to re-shape the projection electrode, the wet-back process is carried out. At this time, if the wet-back process is merely carried out without the semiconductor-device mounting process (specifically, the process of inserting the wire bumps into the projection electrodes), the void may not be perfectly removed.

However, by the testing electrodes being inserted into the projection electrodes in the step (a) of mounting, a concave part according to the shape of the testing electrode is formed in the projection electrode. At this time, the void and the concave part generated in the projection electrode are connected to each other. Under this condition, the wet-back process is carried out. Therefore, the voids may be completely removed. Accordingly, by the wet-back process being carried out after the separating process is finished, namely, after the concave part is formed in the projection electrode, the voids may be completely eliminated and the projection electrodes may be properly shaped.

The object described above is also achieved by a contact-probe device used for testing an object comprising: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; and an arrangement section for positioning the other side of each of the small pieces of wire according to an arrangement of electrodes of the object, the arrangement section having through holes which are arranged according to the arrangement of the electrodes of the object, wherein the small pieces of wire penetrate through the through holes; wherein when the object is tested, the other side of each of the small pieces of wire contacts each of the electrodes of the object, and the small pieces of wire can be elastically bent.

According to the above-mentioned contact-probe device, the small pieces of wire stand straight on the board. Therefore, a strength of the small pieces of the wire may be reduced. Further, elastic power generated in a process in which the small pieces of the wire are elastically bent operates so as to apply stress from the top end of the small piece of wire to the electrode of the object. In addition, the arrangement section operates such that the top ends of the small pieces of the wire are automatically arranged at precise positions even if the top ends of the small pieces of the wires are not fabricated at the precise positions.

The object described above is also achieved by a contact-probe device used for testing an object comprising: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; a soft sheet, through which the small pieces of wire penetrate, supporting a central part of each of the small pieces of wire; an upper-side plate, provided over the soft sheet, for positioning the other side of each of the small pieces of wire according to an arrangement of electrodes of the object, the upper-side plate having first through holes which are arranged according to the arrangement of the electrodes of the object, wherein upper parts of the small pieces of wire which are exposed in an upward direction from the soft sheet penetrate into the first through holes, and top end parts of the upper parts are exposed from the first through holes; and a lower-side plate, provided under the soft sheet, for positioning lower parts of the small pieces of wire, which are exposed in a downward direction from the soft sheet, according to the arrangement of the electrodes of the object, the lower-side plate having second through holes which are arranged according to the arrangement of the electrodes of the object, wherein the lower parts of the small pieces of wire penetrate into the second through holes; wherein when the object is tested, the other side of each of the small pieces of wire contacts each of the electrodes of the object, and the central parts of the small pieces of wire can be elastically bent.

According to the above-mentioned contact-probe device, the upper-side plate operates to position the top end parts of the small pieces of wire. Further, the lower-side plate operates to position the lower parts adjacent to the bottom end parts of the small pieces of wire. Further, the soft sheet operates to prevent the wires from being shorted to each other when the wires are elastically bent.

The object described above is also achieved by a contact-probe device used for testing an object comprising: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; a lower-side plate for positioning lower parts of the small pieces of wire, which are adjacent to the one side of the small pieces of wire, according to the arrangement of the electrodes of the object, the lower-side plate having second through holes which are arranged according to an arrangement of electrodes of the object, wherein the lower parts of the small pieces of wire penetrate into the second through holes; an upper-side plate for positioning the other side of each of the small pieces of wire according to the arrangement of the electrodes of the object, the upper-side plate having first through holes which are arranged according to the arrangement of the electrodes of the object, wherein upper parts of the small pieces of wire which are adjacent to the other side of the small pieces of wire penetrate into the first through holes, and top end parts of the upper parts are exposed from the first through holes; and a supporting frame, provided over the lower-side plate, generating a space between the lower-side plate and the upper-side plate; wherein when the object is tested, the other side of each of the small pieces of wire contacts each of the electrodes of the object, and central parts of the small pieces of wire which are positioned in the space can be elastically bent.

According to the above-mentioned contact-probe device, the upper-side plate operates to position the top end parts of the small pieces of wire, and the lower-side plate operates to position the lower parts adjacent to the bottom end parts of the small pieces of wire. Further, the space enables the wires to be elastically bent.

The object described above is also achieved by a contact-probe device used for testing an object comprising: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; a lower-side plate for positioning lower parts of the small pieces of wire, which are adjacent to the one side of the small pieces of wire, according to the arrangement of the electrodes of the object, the lower-side plate having second through holes which are arranged according to arrangement of electrodes of the object, wherein the lower parts of the small pieces of wire penetrate into the second through holes; an upper-side plate for positioning the other side of each of the small pieces of wire according to the arrangement of the electrodes of the object, the upper-side plate having first through holes which are arranged according to the arrangement of the electrodes of the object, wherein upper parts of the small pieces of wire which are adjacent to the other side of the small pieces of wire penetrate into the first through holes, and top end parts of the upper parts are exposed from the first through holes; a supporting frame, provided over the lower-side plate, generating a space between the lower-side plate and the upper-side plate; and a soft material filling the space; wherein when the object is tested, the other side of each of the small pieces of wire contacts each of the electrodes of the object, and central parts of the small pieces of wire which penetrate through the soft material can be elastically bent.

According to the above-mentioned contact-probe device, the upper-side plate operates to position the top end parts of the small pieces of wire, and the lower-side plate operates to position the lower parts adjacent to the bottom end parts of the small pieces of wire. Further, the soft material operates to prevent the wires from being shorted to each other when the wires are elastically bent.

The object described above is also achieved by a contact-probe device used for testing an object comprising: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; and an upper-side plate for positioning the other side of each of the small pieces of wire according to an arrangement of electrodes of the object, the upper-side plate having through holes which are arranged according to the arrangement of the electrodes of the object, wherein upper parts of the small pieces of wire which are adjacent to the other side of the small pieces of wire penetrate into the through holes, and top end parts of the upper parts are exposed from the through holes; wherein when the object is tested, the other side of each of the small pieces of wire contacts each of the electrodes of the object, and lower parts of the small pieces of wire which are positioned under the upper-side plate can be elastically bent.

According to the above-mentioned contact-probe device, the upper-side plate operates to position the top end parts of the small pieces of wire.

The object described above is also achieved by a contact-probe device used for testing an object comprising: a board having a plurality of electrodes thereon; a positioning frame fixed on the board; and acontact-probe fabrication part, the part including: a soft sheet; a plurality of small pieces of wire penetrating through the soft sheet by which center part of each of the small pieces of wire is supported and having elasticity such that each of the small pieces of wire can bend when stress is applied in an axial direction of each of the small pieces of wire; an upper-side plate, provided over the soft sheet, for positioning top end parts of the small pieces of wire according to an arrangement of electrodes of the object, the upper-side plate having first through holes which are arranged according to the arrangement of the electrodes of the object, wherein upper parts of the small pieces of wire which are exposed in an upward direction from the soft sheet penetrate into the first through holes, and the top end parts of the upper parts are exposed from the first through holes; and a lower-side plate, provided under the soft sheet, for positioning bottom end parts of the small pieces of wire according to the arrangement of the electrodes of the object, the lower-side plate having second through holes which are arranged according to the arrangement of the electrodes of the object, wherein lower parts of the small pieces of wire which are exposed in a downward direction from the soft sheet penetrate into the second through holes, and the bottom end parts of the lower parts are exposed from the second through holes; wherein: the contact-probe fabrication part is placed in the positioning frame; the bottom end parts of the small pieces of wire contact the electrodes of the board; and when the object is tested, the top end parts of the small pieces of wire contact the electrodes of the object, and central parts of the small pieces of wire can be elastically bent.

According to the above-mentioned contact-probe device, the positioning frame is provided and the contact-probe fabrication part is put in the positioning frame. Therefore, the contact-probe fabrication part may easily be exchanged.

The object described above is also achieved by a test method configuration comprising: a contact-probe device used for testing an object including: a board having a plurality of electrodes thereon; a plurality of small pieces of wire standing in the board and having elasticity such that each of the small pieces of wire can bend when stress is applied in an axial direction of each of the small pieces of wire, wherein one side of each of the small pieces of wire is electrically connected and fixed to each of the electrodes of the board; and an arrangement section for positioning the other side of each of the small pieces of wire according to an arrangement of electrodes of the object, the arrangement section having through holes which are arranged according to the arrangement of the electrodes of the object, wherein the small pieces of wire penetrate through the through holes; wherein when the object is tested, the other side of each of the small pieces of wire contacts each of the electrodes of the object, and the small pieces of wire can be elastically bent; a motherboard exchangeably installed in the contact-probe device; and a testing-apparatus body electrically connected to the motherboard.

According to the above-mentioned test method configuration, the contact-probe device may easily be exchanged. Therefore, flexibility of the testing apparatus may be improved.

The object described above is also achieved by a test jig for a semiconductor device comprising: a plurality of wire-type connection members electrically coupled to the semiconductor device when top end parts of the wire-type connection members contact external terminals formed in the semiconductor device; a supporting member fixing and supporting the connection members in a standing form at a position corresponding to a position arrangement of the external terminals; and a wiring board having insertion holes for insertion of the connection members, connection-terminal parts in the insertion holes to be connected electrically to the connection members, and pull-out lines wiring the connection-terminal parts outside the insertion holes.

According to the above-mentioned test jig, the top end parts of the wire-type connection members are electrically connected with the external terminals formed in the semiconductor device. Since the connection members are shaped as the wires, the connection members may be arranged close to each other. Therefore, even if circuits are further integrated and the arrangement pitch of the external terminals in the semiconductor device is narrowed, the test is properly carried out.

Further, the supporting member fixes and supports the connection members in the standing form at the position corresponding to the position arrangement of the external terminals. Therefore, the connection members may be inserted together into the insertion holes formed in the wiring board. Since the supporting member is formed by the insulating member, the plurality of connection members are prevented from being shorted to each other through the supporting member.

In addition, in the wiring board, the connection-terminal parts electrically connected to the connection members and the pull-out lines wiring the connection-terminal parts outside the insertion holes are formed. Therefore, the electrical connection with the connection members may be processed by using the wiring board. In this way, by electrically wiring the connection members by using the wiring board, a wiring structure of the connection-terminal parts may be simplified.

The object described above is also achieved by the test jig mentioned above, wherein the wiring board is formed by one of a glass-epoxy board, a ceramic board, and a polyimide-film board.

According to the above-mentioned test jig, when the wiring board is formed by the glass-epoxy board, cost of the test jig may be reduced. When the wiring board is formed by one of the ceramic board and the polyimide-film board, the arrangement pitch of the connection members may be narrowed.

The object described above is also achieved by the test jig mentioned above, wherein the test jig further comprises at least one wiring board, a plurality of the wiring boards being arranged in a layered form.

According to the above-mentioned test jig, the plurality of the wiring boards are arranged in the layered form. Therefore, the position arrangement of the pull-out lines in the wiring boards may flexibly be determined. Accordingly, the arrangement pitch of the connection member may be narrowed.

The object described above is also achieved by the test jig mentioned above, wherein the test jig further comprises an insulating member, provided between the plurality of the wiring boards, for the connection members to penetrate therethrough.

According to the above-mentioned test jig, the insulating member for the connection members to penetrate therethrough is provided between the plurality of the wiring boards. Therefore, the connection-terminal parts and the pull-out lines in the wiring boards are prevented from being shorted between the wiring boards. Further, since the insulating member has a function of supporting the connection members, a mechanical strength of the connection members may be improved.

The object described above is also achieved by the test jig mentioned above, wherein the supporting member is formed by an elastic material.

According to the above-mentioned test jig, since the supporting member is formed by the elastic material, the supporting member may elastically change its shape and the top end parts of the connection members may move in upward and downward directions. Therefore, even if the length of the connection members is dispersed due to a size error, etc., the top end parts of the connection members may positively and electrically be connected to the external terminals of the semiconductor device.

The object described above is also achieved by the test jig mentioned above, wherein the test jig further comprises a conductive member provided in parts of the connection members which are exposed from the wiring board, and electrically connected to the connection-terminal parts.

According to the above-mentioned test jig, the conductive member electrically connected to the connection-terminal parts are provided in the parts of the connection members which are exposed from the wiring board. Therefore, the connection members may positively and electrically be connected to the connection-terminal parts.

The object described above is also achieved by the test jig mentioned above, wherein the plurality of the wiring boards are electrically connected to each other by using one of a tape-automated bonding (TAB) method, a bump method, and a wire method.

According to the above-mentioned test jig, by using one of the TAB method, the bump method, and the wire method, the electrical connection between the layered wiring boards may easily and positively be performed.

The object described above is also achieved by the test jig mentioned above, wherein the test jig further comprises a pin-type terminal inserted into the wiring board so as to be connected electrically to the pull-out lines, and the pin-type terminal is electrically connected to the motherboard when the test is carried out.

According to the above-mentioned test jig, the pin-type terminal inserted into the wiring board is provided so as to be connected electrically to the pull-out lines, and the pin-type terminal is electrically connected to the motherboard when the test is carried out. Therefore, by using the pin-type terminal, the test jig may be connected to the motherboard, and, thus, the connection operation may easily be carried out.

The object described above is also achieved by the test jig mentioned above, wherein the test jig further comprises a connection section for directly and electrically connecting the wiring board to the motherboard when the test is carried out.

According to the above-mentioned test jig, the wiring board is directly connected to the motherboard. Therefore, other means for connecting the wiring board to the motherboard is unnecessary. Accordingly, by the simple configuration, the wiring board and the motherboard may electrically be connected.

The object described above is also achieved by the test jig mentioned above, wherein the test jig further comprises a configuration capable of setting a plurality of semiconductor devices to be tested.

According to the above-mentioned test jig, since the plurality of semiconductor devices are provided, operation efficiency in the test may be improved.

The object described above is also achieved by the test jig mentioned above, wherein the test jig further comprises a socket accommodating the connection members, the supporting member, and the wiring board, and a lid part, provided in the socket, pushing the semiconductor device to the connection members when the lid part is closed.

According to the above-mentioned test jig, the connection members, the supporting member, and the wiring board are accommodated in the socket, and the lid part provided in the socket pushes the semiconductor device to the connection members when the lid part is closed. Therefore, when the semiconductor device is tested, positioning of the semiconductor device may positively be performed. Accordingly, connection of the external terminals of the semiconductor device and the connection members is prevented from being degraded due to a position error of the semiconductor device.

Other objects and further features of the present invention will be apparent from the following detailed description when read in conjunction with the accompanying drawings.

BRIEF DESCRIPTION OF THE DRAWINGS

FIG. 24 shows a cross-sectional view of a fifth embodiment of a contact-probe device according to the present invention;

FIG. 25 shows a cross-sectional and perspective view of a sixth embodiment of a contact-probe device according to the present invention;

DESCRIPTION OF THE PREFERRED EMBODIMENTS

Figure 6:
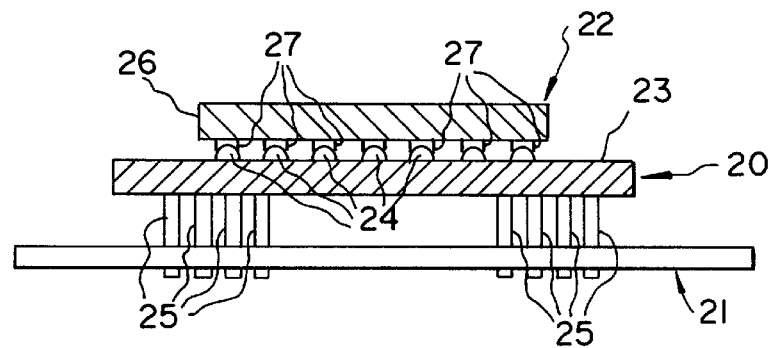
FIG. 6 shows an illustration for explaining a first embodiment of the test board of a semiconductor device and the method of testing the semiconductor device according to the present invention.

First, a description will be given of a first embodiment of a test board of a semiconductor device and a method of testing the semiconductor device according to the present invention, by referring to FIG. 6. FIG. 6 shows an illustration for explaining the first embodiment of the test board of the semiconductor device and the method of testing the semiconductor device according to the present invention. In FIG. 6, a test board 20 which is currently used for a test process is shown. In the test process, the test board 20 is installed in a burn-in test board 21. On the test board 20, a semiconductor device 22 to be tested is installed.

In the following description, a bare-chip-type semiconductor element to be tested is shown. However, a plastic-sealed semiconductor device having projection electrodes, for example, a semiconductor device having a ball-grid-array (BGA) structure, may be applied to the test. Therefore, in the specification, if the bare-chip-type semiconductor device and the plastic-sealed semiconductor device have the projection electrodes, these semiconductor devices are wholly referred to as the semiconductor device 22.

Figure 7:
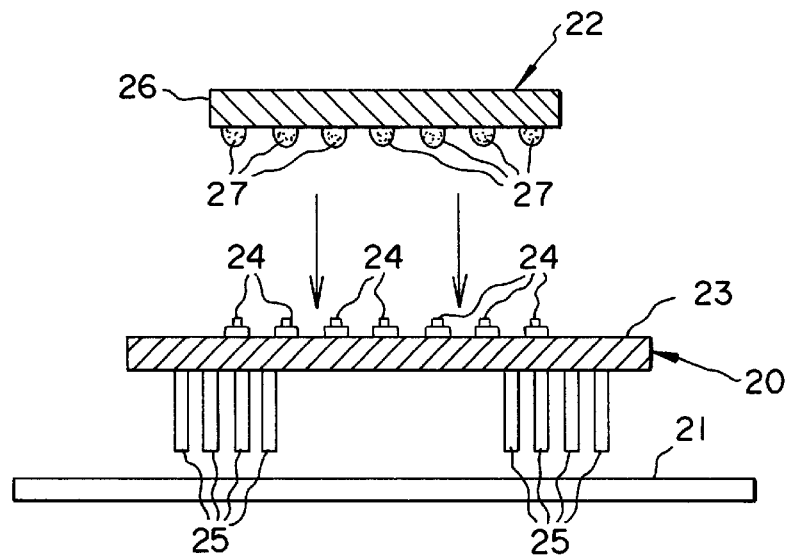
FIG. 7 shows an illustration in which the test board, the burn-in test board, and the semiconductor device shown in FIG. 6 are separated.
Figure 5:
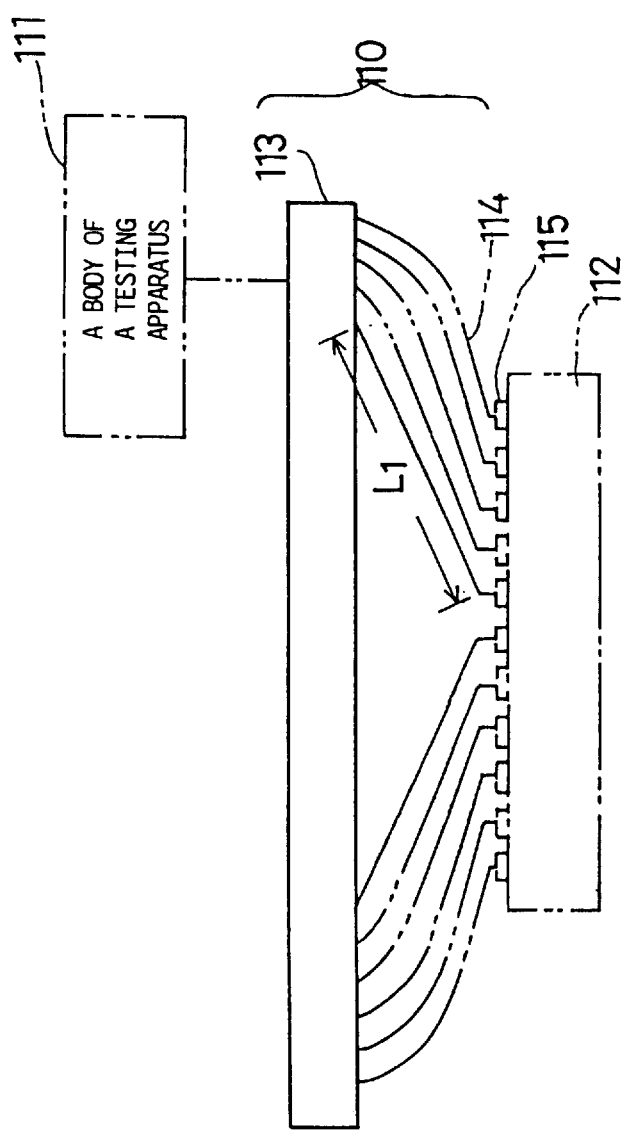
FIG. 5 shows a configuration example of a prior-art contact-probe device.

In the following, a detail configuration of the test board 20 will be described, by referring to FIG. 6 and FIG. 7. FIG. 7 shows an illustration in which the test board 20, the burn-in test board 21, and the semiconductor device 22 shown in FIG. 6 are separated from each other.

The test board 20 is constructed with at least a main board 23, testing electrodes 24, board connection ports 25. The main board 23 is, for example, a multilayer print board, and on the main board 23, a large number of testing electrodes 24 are formed. Each of the testing electrodes 24 has a wire bump structure, which is made of, for example, gold (Au). Therefore, the testing electrodes 24 (which are referred to as the wire bumps, hereinafter) are constructed such that gold wires are standing vertically on the main board 23.

The wire bumps 24 are formed in an inter-connection pattern (not shown) on the main board 23. Since a conventional wire bonding apparatus used in a semiconductor manufacturing process is used for forming the wire bumps 24, the wire bumps 24 may be formed easily and efficiently.

In the wire bonding apparatus, a position of cutting the gold wire can be easily changed. Therefore, a height of the wire bump 24 from a surface of the main board 23 is also easily set by controlling the wire bonding apparatus. Also, the height of the wire bump 24 may be changed at each wire bump 24.

Figure 8:
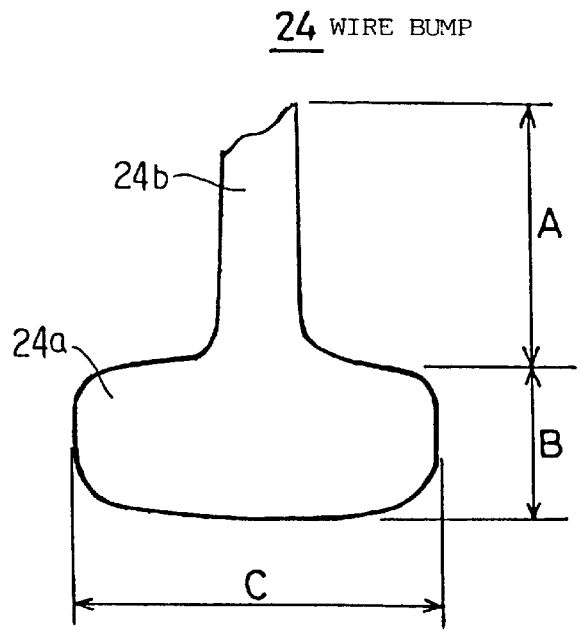
FIG. 8 shows a configuration of a wire bump shown in FIG. 6.

FIG. 8 shows a configuration of the wire bump 24 shown in FIG. 6. In FIG. 8, the wire bump 24 comprises a pedestal part 24a having a given bottom area and a projection part 24b extending upward from the pedestal part 24a. A cross-sectional area of the projection part 24b is less than the bottom area of the pedestal part 24a, and is formed so that the projection part 24b can be easily inserted into a projection electrode arranged on the semiconductor device (which will be described in further detail later). In FIG. 8, a length represented by an arrow A is approximately 40 μm, a length represented by an arrow B is approximately 30 μm, and a length represented by an arrow C is approximately 100 μm.

The board connection ports 25 are pin-type electrodes which are arranged to extend downwardly from a bottom face of the main board 23. An upper end part of each board connection port 25 is connected to the main board 23 to be supported. The upper end part of the board connection port 25 is electrically connected with the wire bump 24 through the inter connection or a surface connection. Therefore, the wire bumps 24 and the board connection ports 25 are electrically connected through the above connections.

On the other hand, a lower end part of each board connection port 25 is connected to the burn-in test board 21. The burn-in test board 21 is connected to a burn-in test apparatus (not shown). The burn-in test apparatus supplies a given signal to the semiconductor device 22 to be tested through the burn-in test board 21 and the test board 20. A signal generated in the semiconductor device 22 is received in the burn-in test apparatus through the test board 20 and the burn-in test board 21. In this way, the burn-in test apparatus examines whether the semiconductor device 22 is a good article or an article to be rejected.

In the above method, a plurality of test boards 20 may be arranged on the burn-in test board 21, and a plurality of semiconductor devices 22 are simultaneously tested.

The semiconductor device 22 mounted on the test board 20 is, for example, a semiconductor device used for a multichip module (MCM). In this case, a plurality of projection electrodes (bumps) 27 are formed on a bottom face (which is facing to the top surface of the main board 23) of the bare-chip-type element body 26. The projection electrode 27 is made of solder which is an alloy of lead (Pb) and tin (Sn). The solder (Pb/Sn) is softer than gold (Au). Therefore, mechanical strength (hardness) of the wire bump 24 made of gold (Au) is stronger than that of the projection electrode 27 made of solder.

Next, a description will be given of a method of testing the semiconductor device 22 by using the above-mentioned test board 20.

In the test of the semiconductor device 22, first, as a semiconductor-device mounting process, the semiconductor device 22 is mounted on the test board 20. Before the semiconductor-device mounting process, the test board 20 is previously installed in the burn-in test board 21.

Arranged positions of the wire bumps 24 formed on the test board 20 are associated with arranged positions of the projection electrodes 27 formed on the semiconductor device 22. Therefore, after the positioning of the wire bumps 24 and the projection electrodes 27 is carried out, the semiconductor device 22 is pressed to the test board 20. The above process is performed under normal temperature (in which the projection electrode 27 made of solder is not melted).

As mentioned before, the solder (Pb/Sn) of the projection electrode 27 has a mechanical strength (hardness) less than that of gold (Au) forming the wire bump 24. Therefore, by pressing the semiconductor device 22 to the test board 20, the wire bump 24 is inserted into the projection electrode 27.

Figure 9:
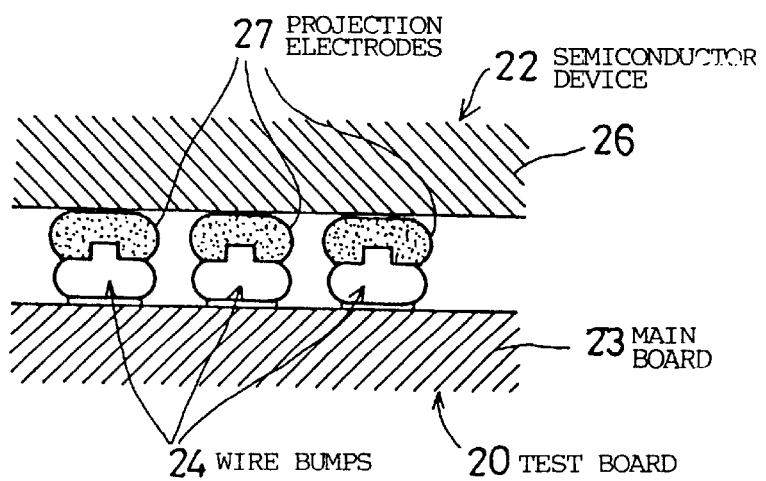
FIG. 9 shows an expanded illustration for explaining a condition in which the wire bumps are inserted into projection electrodes.

In this way, since it is possible to carry out the process of inserting the wire bump 24 into the projection electrode 27 under normal temperature, it is unnecessary to apply heat in the semiconductor-device mounting process. Therefore, the projection electrode 27 are prevented from being degraded by heat. FIG. 9 shows an expanded illustration for explaining the condition in which the wire bumps 24 are inserted into the projection electrodes 27.

In this way, by thrusting the wire bumps 24 into the projection electrodes 27 in the semiconductor-device mounting process, the wire bumps 24 may be electrically connected to the projection electrodes 27. When the wire bumps 24 are inserted into the projection electrodes 27, relatively weak pressure (approximately 2 to 5 grams a bump) is required. However, after the wire bumps 24 are inserted into the projection electrodes 27, it is not necessary to go on pressing the semiconductor device 22 to the test board 20.

Figure 1:
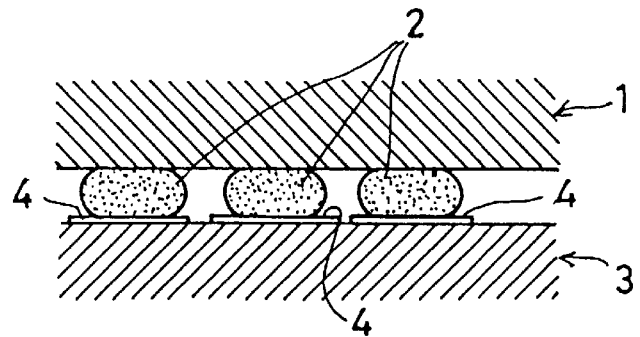
FIG. 1 shows an illustration for explaining a second conventional testing method of a semiconductor device.
Figure 2:
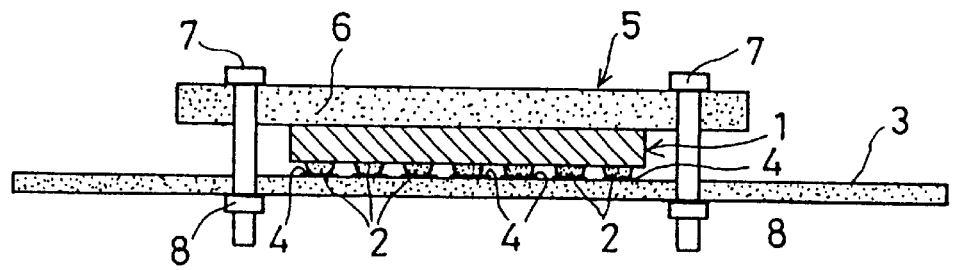
FIG. 2 shows an illustration for explaining a third conventional testing method of a semiconductor device.
Figure 3:
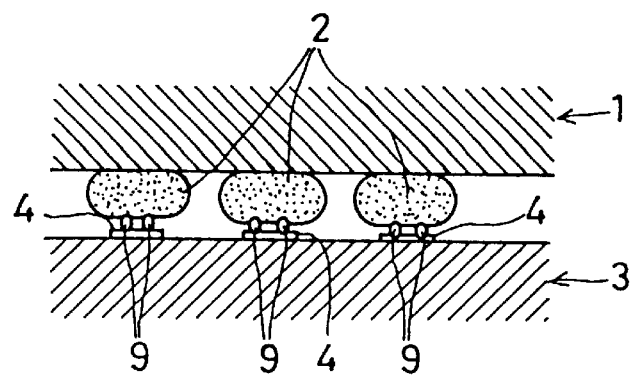
FIG. 3 shows an illustration for explaining a fourth conventional testing method of a semiconductor device.
Figure 4:
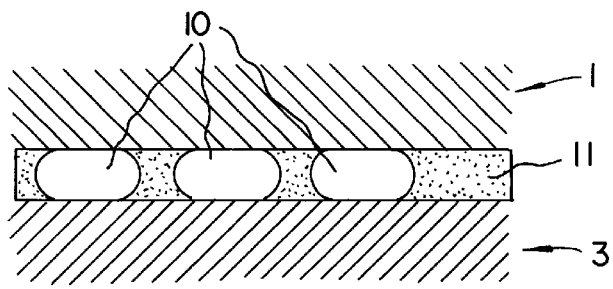
FIG. 4 shows an illustration for explaining a fifth conventional testing method of a semiconductor device.

The above pressure is less than the pressure required for the conventional method. In further detail, for example, in the second conventional method shown in FIG. 2, a pressure of approximately 6 to 20 grams a bump is required. On the contrary, in the first embodiment, the pressure may be reduced to approximately 2 to 5 grams a bump.

Therefore, the wire bumps 24 and the projection electrodes 27 are prevented from being bent or damaged. As compared to the second conventional method shown in FIG. 2, the fixed jig 5 becomes unnecessary, and, thus, the configuration of the test board 20 may be simplified.

Further, in the first embodiment, when the semiconductor device 22 is mounted on the test board 20, a portion of each wire bump 24 goes into the projection electrode 27. Therefore, a strong mechanical connecting strength (specifically, connecting strength in a horizontal direction) between the wire bumps 24 and the projection electrodes 27 is obtained. Accordingly, the semiconductor device 22 is prevented from unexpectedly separating from the test board 20.

In general, it is known that an oxide film is formed on a surface of solder. In the embodiment, when the wire bumps 24 are thrust into the projection electrodes 27, the wire bumps 24 penetrate through the oxide film formed on the surface of the projection electrodes 27, and are connected with the projection electrodes 27. Therefore, it is ensured that the wire bumps 24 are electrically connected with the projection electrodes 27.

Further, when the wire bumps 24 are electrically connected with the projection electrodes 27, it is not necessary to provide other conductive material between the wire bumps 24 and the projection electrodes 27, and between the semiconductor device 22 and the main board 23. Therefore, the other conductive material is prevented from being mixed into the projection electrodes 27. Accordingly, reliability of the projection electrodes 27 may be improved.

After the semiconductor-device mounting process is completed, a testing process starts, and a given test is performed for the semiconductor device 22 by using the wire bumps 24 connected with the projection electrodes 27. In the testing process, as mentioned before, the burn-in test apparatus supplies the given signal to the semiconductor device 22 to be tested through the burn-in test board 21 and the test board 20. The signal generated in the semiconductor device 22 is received in the burn-in test apparatus through the test board 20 and the burn-in test board 21. In this way, the burn-in test apparatus examines whether the semiconductor device 22 is a good article or an article to be rejected.

At this time, the semiconductor device 22 is securely mounted on the test board 20, and the wire bumps 24 are positively electrically connected with the projection electrodes 27. Therefore, the semiconductor device 22 may be tested with a high level of accuracy, namely a highly accurate burn-in test may be performed.

Figure 10:
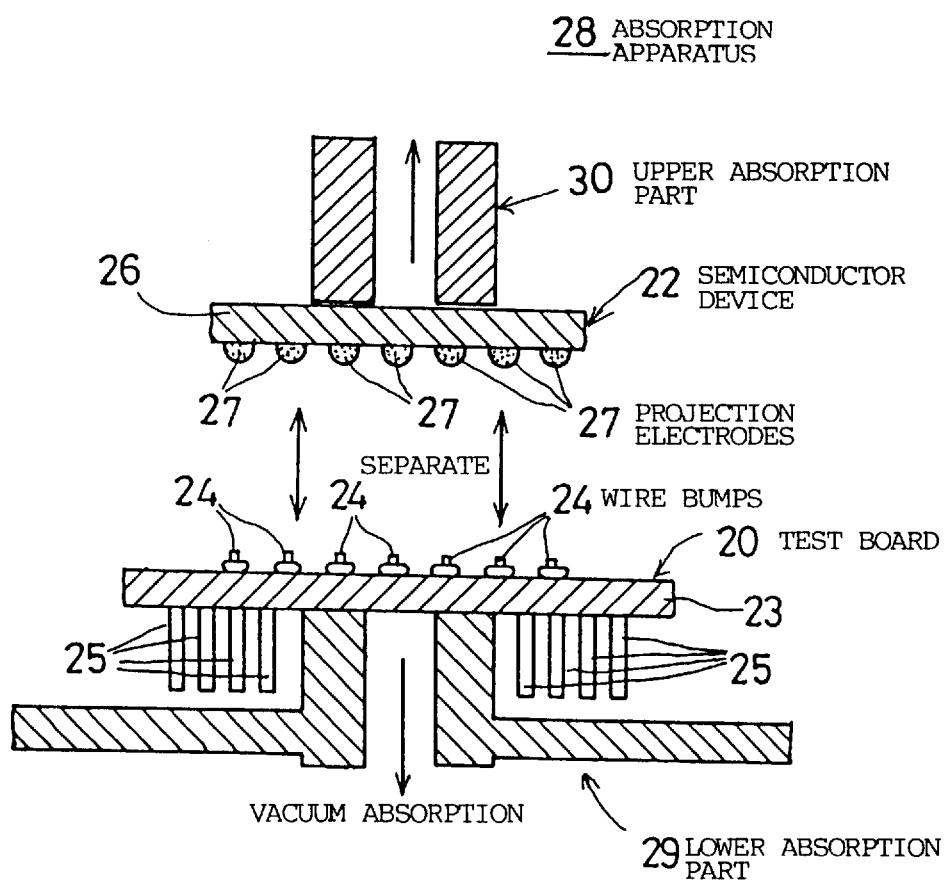
FIG. 10 shows an illustration for explaining a separating process of separating the semiconductor device from the test board.

After the testing process is completed, a separating process starts to separate the semiconductor device 22 from the test board 20. FIG. 10 shows an illustration for explaining the separating process of separating the semiconductor device from the test board.

As shown in FIG. 10, in the separating process, the test board 20 with the semiconductor device 22 is set in an absorption apparatus 28. The absorption apparatus 28 comprising a lower absorption part 29 and an upper absorption part 30, each part being connected to a vacuum pump (not shown). Each of the lower absorption part 29 and the upper absorption part 30 can flexibly move in a vertical direction in FIG. 10.

When the absorption apparatus 28 is set, the lower absorption part 29 is positioned so as to contact a central part of a back face of the test board 20, and the upper absorption part 30 is positioned so as to contact a top face of the semiconductor device 22. After that, force of the vacuum pump is applied to the lower and upper absorption parts 29, 30. The test board 20 is acted on by the lower absorption part 29, and the semiconductor device 22 is acted on by the upper absorption part 30. The lower and upper absorption parts 29, 30 are moved apart from each other. In this way, the semiconductor device 22 is separated from the test board 20.

As mentioned before, the semiconductor device 22 and the test board 20 are connected to each other by the wire bumps 24 inserted into the projection electrodes 27. Therefore, in the above separating process, the semiconductor device 22 is moved apart from the test board 20, and thereby the wire bumps 24 may be easily separated from the projection electrodes 27. The separating process may be carried out under normal temperature conditions, and, thus, the projection electrodes 27 are prevented from being degraded by heat in the separating process.

Further, when the projection electrodes 27 are separated from the wire bumps 24, no portion of the projection electrode 27 remains in the wire bump 24, and no portion of the wire bump 24 remains in the projection electrode 27. Therefore, it is possible to repeatedly use the test board 20, and it becomes unnecessary to adjust the wire bumps 24 for each test. Furthermore, since impurities are prevented from being mixed into the projection electrodes 27, reliability of the projection electrodes 27 may be improved.

After the separating process is completed, a wet-back process starts. In the wet-back process, the form of the projection electrodes 27 is re-shaped. The wet-back process is also performed in the conventional method. In the wet-back process, the projection electrodes 27 are heated and melted to obtain a good shape and a good luster. When the projection electrodes 27 are formed by plating, voids occurring in the projection electrodes 27 by the plating process may be removed in the wet-back process.

By carrying out the wet-back process after the separating process is completed, the process of shaping the projection electrodes 27 may be properly performed. In the following, the wet-back process will be described.

As one of methods of forming the projection electrode 27, a plating method is known. When the projection electrodes 27 are formed by the plating method, a void may be generated within a projection electrode 27 when solder is plated. The projection electrode 27 in which the void is generated has a different shape as compared to a normal projection electrode in which no void is generated. Therefore, to remove the void and to re-shape the projection electrode 27, the wet-back process is carried out. At this time, if the wet-back process is merely carried out without the semiconductor-device mounting process (specifically, the process of inserting the wire bumps 24 into the projection electrodes 27), the void may not be completely removed.

Figure 11A:
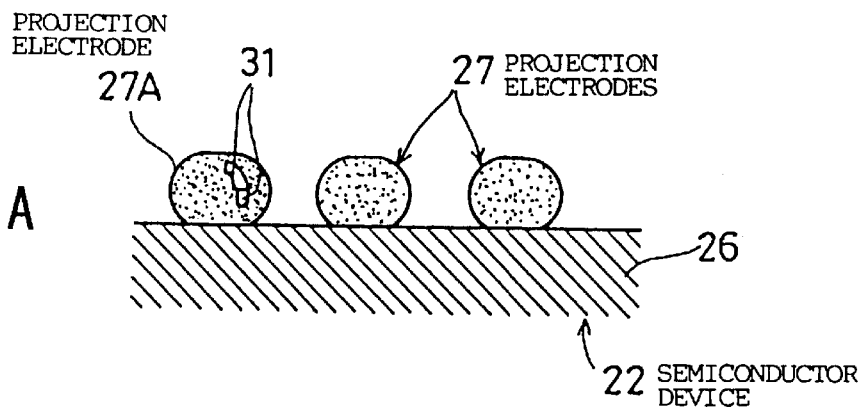
FIG. 11A to FIG. 11C show illustrations for explaining a process of removing a void.
Figure 11B:
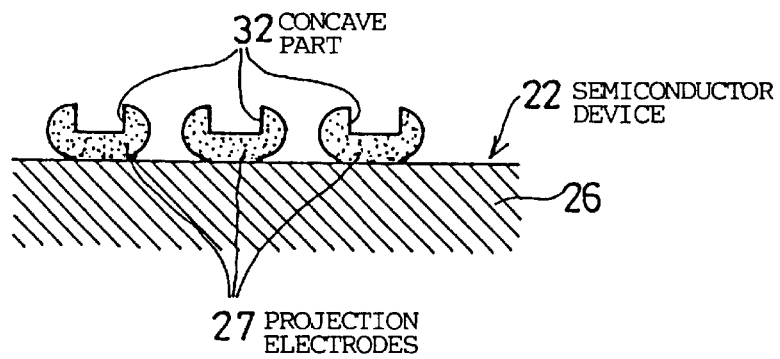
Figure 11C:
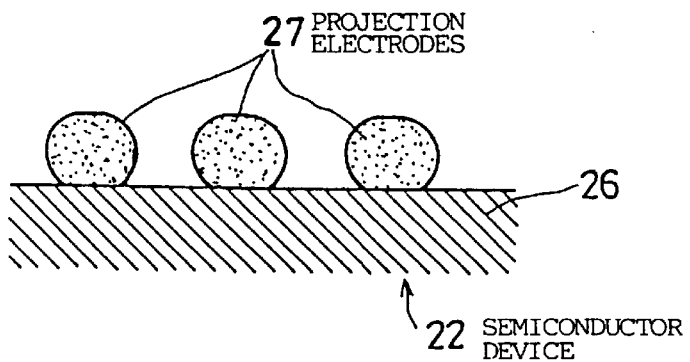

FIG. 11A to FIG. 11C show illustrations for explaining a process of removing the void. FIG. 11A shows the projection electrodes 27 which are shaped in a globular form after the plating process is carried out. In the projection electrode 27A shown to the left in FIG. 11A, void 31 is generated. In this case, if the wet-back process is carried out merely for the projection electrode 27A in which the void 31 is generated, the void 31 may remain.

Therefore, as shown in FIG. 11B, when the wire bumps 24 are inserted into the projection electrodes 27 in the semiconductor-device mounting process, a concave part 32 corresponding to the shape of the wire bump 24 is formed in the projection electrode 27. At this time, the void 31 generated in the projection electrode 27A may be connected with the concave part 32.

After the void 31 is connected with the concave part 32 and is exposed externally, the wet-back process is carried out. Therefore, the void 31 may be completely removed. In this way, by performing the wet-back process after the separating process is completed, the projection electrodes 27, each of which has a good globular form without the void, may be formed, as shown in FIG. 11C.

Figure 12:
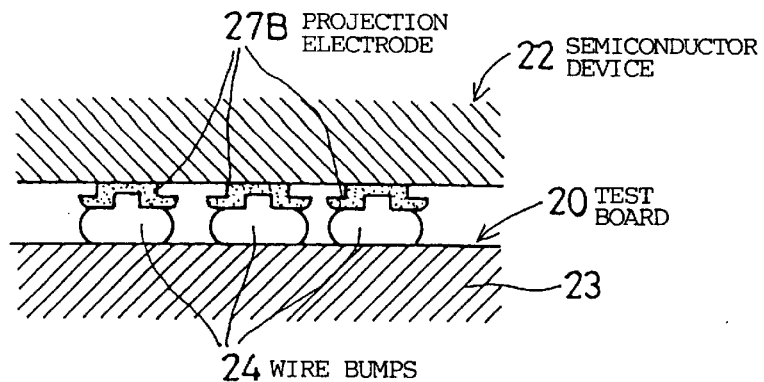
FIG. 12 to FIG. 14 show first, second and third modifications of the first embodiment of the test board of the semiconductor device and the method of testing the semiconductor device according to the present invention.
Figure 13:
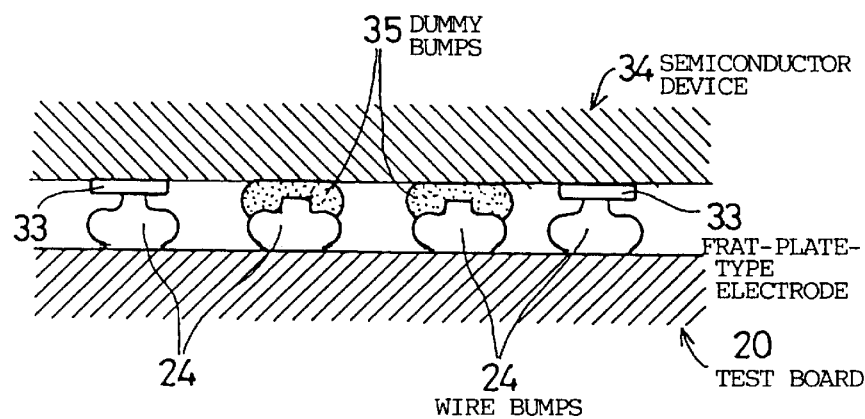
Figure 14:
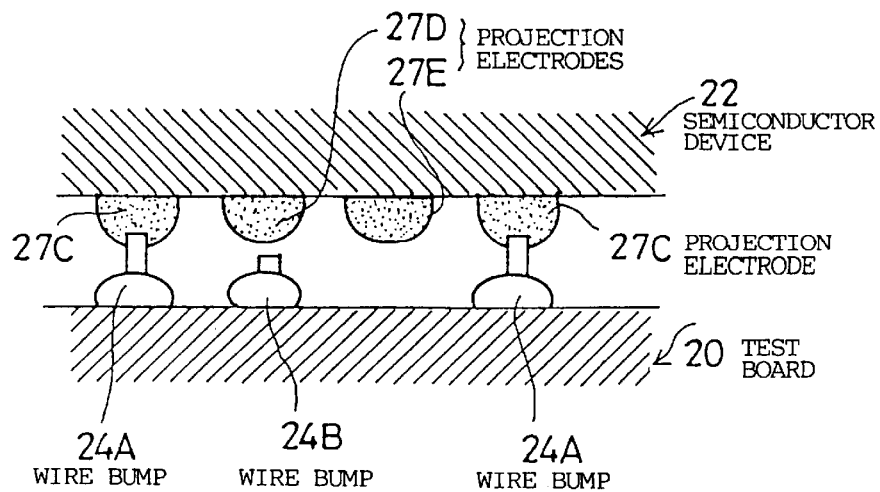

Next, descriptions will be given of modifications of the first embodiment of the test board of the semiconductor device and the method of testing the semiconductor device according to the present invention, by referring to FIG. 12 to FIG. 14. FIG. 12 to FIG. 14 show first, second and third modifications of the first embodiment of the test board of the semiconductor device and the method of testing the semiconductor device according to the present invention.

In a configuration shown in FIG. 12, the wire bumps 24 are directly used for the projection electrodes 27B which are formed by the plating method to test the semiconductor device 22. In general, just after the projection electrodes 27B are formed by the plating method, each projection electrode 27 has a brim-shaped top end part. Therefore, in the above-mentioned first embodiment, the projection electrode 27B having the brim-shaped top end part is shaped to the projection electrode 27 in the globular form in the manufacturing process of the semiconductor device 22. In the shaping process, the projection electrode 27B having the brim-shaped top end part is heated and melted, and is shaped to the globular form by surface tension.

Even if the projection electrode 27B is shaped to the globular form in the manufacturing process of the semiconductor device 22, the concave part 32 is formed in the globularly shaped projection electrode 27 by the wire bump 24 being inserted (refer to FIG. 11B). After that, the wet-back process is carried out and the projection electrode 27 is shaped again.

In the first modification of the first embodiment, the two shaping processes for the projection electrode 27 carried out in the first embodiment are reduced to one shaping process. Whereby, the processes of manufacturing and testing the semiconductor device 22 may be simplified. To meet the above purpose, the first shaping process of the projection electrode 27 which is carried out before testing the semiconductor device 22 is omitted. Thus, the projection electrodes 27B, just after being formed by the plating method, have the wire bumps 24 inserted to test the semiconductor device 22.

According to the configuration of the first modification, the number of heating process for the projection electrodes 27 may be reduced. Therefore, the projection electrodes 27 are prevented from being damaged. Further, the processes of manufacturing and testing the semiconductor device 22 may be simplified.

In the configuration of the second modification of the first embodiment shown in FIG. 13, a semiconductor device 34 having a flat-plate-type electrode 33 (which is referred to as a flat electrode 33) may be tested.

As is well known, as the electrode of the semiconductor device, the flat electrodes 33 are also used as well as projection electrodes 27. The test board 20 and the method according to the present invention are also applicable to the semiconductor device 34 in which the flat electrodes 33 are arranged.

To test the semiconductor device 34 having the flat electrodes 33 by using the test board 20, dummy bumps 35 are previously formed in areas where no flat electrodes 33 are formed on the element body 26, and the wire bumps 24 are arranged so that the positions of the wire bumps 24 correspond to the positions of the flat electrodes 33 and the dummy bumps 35.

Further, the height of each wire bump 24 is adjusted so that the corresponded wire bumps 24 can positively contact with the flat electrodes 33 when the wire bumps 24 are inserted into the dummy bumps 35. As mentioned before, since the wire bumps 24 are formed by using the wire bonding apparatus, the height of each wire bump 24 can be flexibly set.

In the above configuration, when the wire bumps 24 are inserted into the dummy bumps 35, the semiconductor device 34 may be positively mounted on the test board 20. Even if the semiconductor device 34 has the flat electrodes 33 of the flat-plate shape, it is certain the wire bumps 24 and the flat electrode 33 are electrically connected to each other.

In the third modification of the first embodiment shown in FIG. 14, the wire bumps 24 are selectively connected to specified electrodes of a plurality of projection electrodes 27, and the test of the semiconductor device 22 is performed.

In FIG. 14, in general, though a large number of electrodes are formed on the semiconductor device 22, specified electrodes, for example, power supply electrodes, ground electrodes, may not need to be tested. If the wire bumps 24 are inserted into such specified electrodes which do not need to be tested, the specified projection electrodes 27 may be unnecessarily changed in their shape. Thus, the projection electrodes 27 may be degraded.

Therefore, in the third modification, the height of each wire bump 24 is adjusted and the arranged positions of the wire bumps 24 are adjusted. Thus, the wire bumps 24 are not inserted into the specified projection electrodes 27 which do not need to be tested.

In FIG. 14, two wire bumps 24A correspond to two projection electrodes 27C which need to be connected for the test, and a wire bump 24B corresponds to a projection electrode 27D which does not need to be tested. In this case, the height of the wire bump 24A is adjusted to be higher than the height of the wire bump 24B. For a projection electrode 27E which does not need to be tested, no wire bump 24 is arranged at the corresponding position.

As mentioned above, in the embodiment, the height and the arranged position of each wire bump 24 is adjusted according to the necessity of the test of the projection electrodes 27. Therefore, the projection electrodes 27C which need to be tested may be selectively tested, and, thus, the specified projection electrodes 27 which do not need to be tested are prevented from being unnecessarily changed in shape.

Next, a description will be given of the metallic relationship between the wire bumps 24 and the projection electrodes 27 when the wire bumps 24 are inserted into the projection electrodes 27 as shown in FIG. 9.

When the wire bumps 24 are made of gold (Au) and the projection electrodes 27 are made of solder (Pb/Sn), and when the wire bumps 24 are inserted into the projection electrodes 27, there is no possibility that under normal temperature, the wire bumps 24 will react with the projection electrodes 27 so as to produce an alloy or a metallic compound.

However, by an experiment of the inventor, the following has been determined. When the wire bumps 24 are inserted into the projection electrodes 27 and in that condition, the burn-in test is carried out and the heating process at 150° C. (which is referred to as a usage temperature, hereinafter) is carried out, the gold (Au) of the wire bumps 24 may be mixed into the projection electrodes 27, and an alloy of gold and tin (Au/Sn) may be produced within the projection electrodes 27. Also, when the gold content of the projection electrodes 27 is measured after the burn-in process is finished, it is found that the gold content is very small and is less than 100 to 200 ppm.

As is well known, when the alloy of gold and tin (Au/Sn) is produced within the solder (Pb/Sn), the solder becomes fragile and its mechanical strength is degraded. However, when the gold content of the projection electrodes 27 is very small as in the range of less than 100 to 200 ppm, the solder is not be degraded. When the semiconductor device 22 is mounted on the test board 20, positive mounting and reliability may always be obtained.

However, in some equipment and apparatus in which the semiconductor device 22 is used, extremely high reliability is required for the semiconductor device 22. In this case, even if the gold (Au) content of the projection electrodes 27 is very small, such impurities being contained in the projection electrodes 27 may be undesired. To solve the above problem, some methods are proposed. By these methods, the material of the wire bumps 24 will not adversely influence the projection electrodes 27.

In a first method, an additive is added to the base material (Au in the above embodiment) which forms the wire bumps 24 (electrodes to be tested). In this way, the wire bumps 24 are formed such that the wire bumps 24 and the projection electrodes 27 do not produce the alloy or the metallic compound under the usage temperature of the burn-in process.

In this case, for the additive of the base material of gold (Au), silicon (Si), molybdenum (Mo), chrome (Cr), vanadium (V), iron (Fe), nickel (Ni), manganese (Mn), etc., are usable. The base material making the wire bumps 24 is not limited to gold (Au), and for the base material, palladium (Pd), copper (Cu), aluminum (Al), solder (Pb/Sn), low-melting-point solder (Pb/In/Au), the alloy of gold and tin (Au/Sn), etc., are usable.

When a base material other than gold (Au) is used for the wire bumps 24, the additive for the base material may be, silicon (Si), molybdenum (Mo), chrome (Cr), vanadium (V), iron (Fe), nickel (Ni), manganese (Mn), etc.

Each of the above-described materials for the additive has a relatively high temperature melting point. Therefore, when such materials are added to the base material of the wire bumps 24, the melting point of the wire bumps 24 is also increased. In this case, the usage temperature of the burn-in process may not melt the wire bumps 24. Accordingly, the material making the wire bumps 24 is prevented from being mixed into the projection electrodes 27.

In an experiment by the inventor when palladium (Pd) was used for the base material of the wire bumps 24, the palladium (Pd) content of the projection electrodes 27 after the burn-in process is very small, less than 100 to 200 ppm.

As for the base material for the wire bumps 24, each of palladium (Pd), copper (Cu), and aluminum (Al) has a relatively high melting point. Therefore, for the same reason as that mentioned above, the material making the wire bumps 24 is prevented from being mixed into the projection electrodes 27.

The solder (Pb/Sn) and the low-melting-point solder (Pb/In/Au) are the same kind of material as that of the projection electrodes 27. Therefore, even if such material is mixed into the projection electrodes 27, no problems are presented. The alloy of gold and tin (Au/Sn) includes gold (Au) which is undesired to be mixed into the projection electrodes 27. However, since tin is included in the alloy, the amount of gold (Au) which is mixed to the projection electrodes 27 may be reduced.

As mentioned above, in the first method, since the material making the wire bumps 24 is not mixed into the material of the projection electrodes 27 at the usage temperature, it prevents the alloy or the metallic compound is prevented from being produced. Therefore, degradation of the projection electrodes 27 may be prevented.

Figure 15:
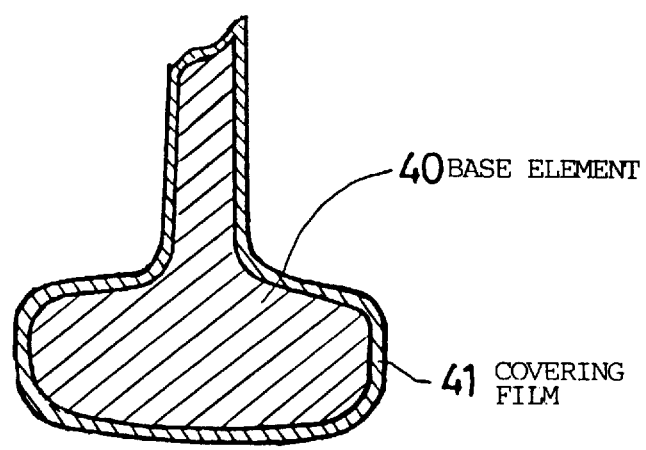
FIG. 15 shows a wire bump being covered by a covering film.

Next, a second method will be described by referring to FIG. 15. FIG. 15 shows a wire bump being covered by a covering film. In the second method, a covering film 41 is formed on the surface of the base element 40 of the wire bump 24. The covering film 41 is made of a material which does not produce an alloy or metallic compound by chemical reaction with the projection electrodes 27 at the usage temperature.

As mentioned above, the material of the covering film 41 needs to be the material which does not produce the alloy or the metallic compound by the projection electrodes 27 of solder (Pb/Sn) at the usage temperature. For such a material, tin (Sn) or nickel (Ni), etc., are usable. The covering film 41 may be easily formed on the surface of the base element 40 by using a conventional apparatus, for example, a sputtering apparatus, used in the semiconductor-device manufacturing process. In this case, even if the alloy is generated between the covering film 41 and the base element 40, no problems are presented.

In this way, by using the second method, since the material of the wire bumps 24 is not mixed into the material of the projection electrodes 27 at the usage temperature, the alloy or the metallic compound is prevented from being produced. Therefore, degradation of the projection electrodes 27 may be prevented.

Figure 16:
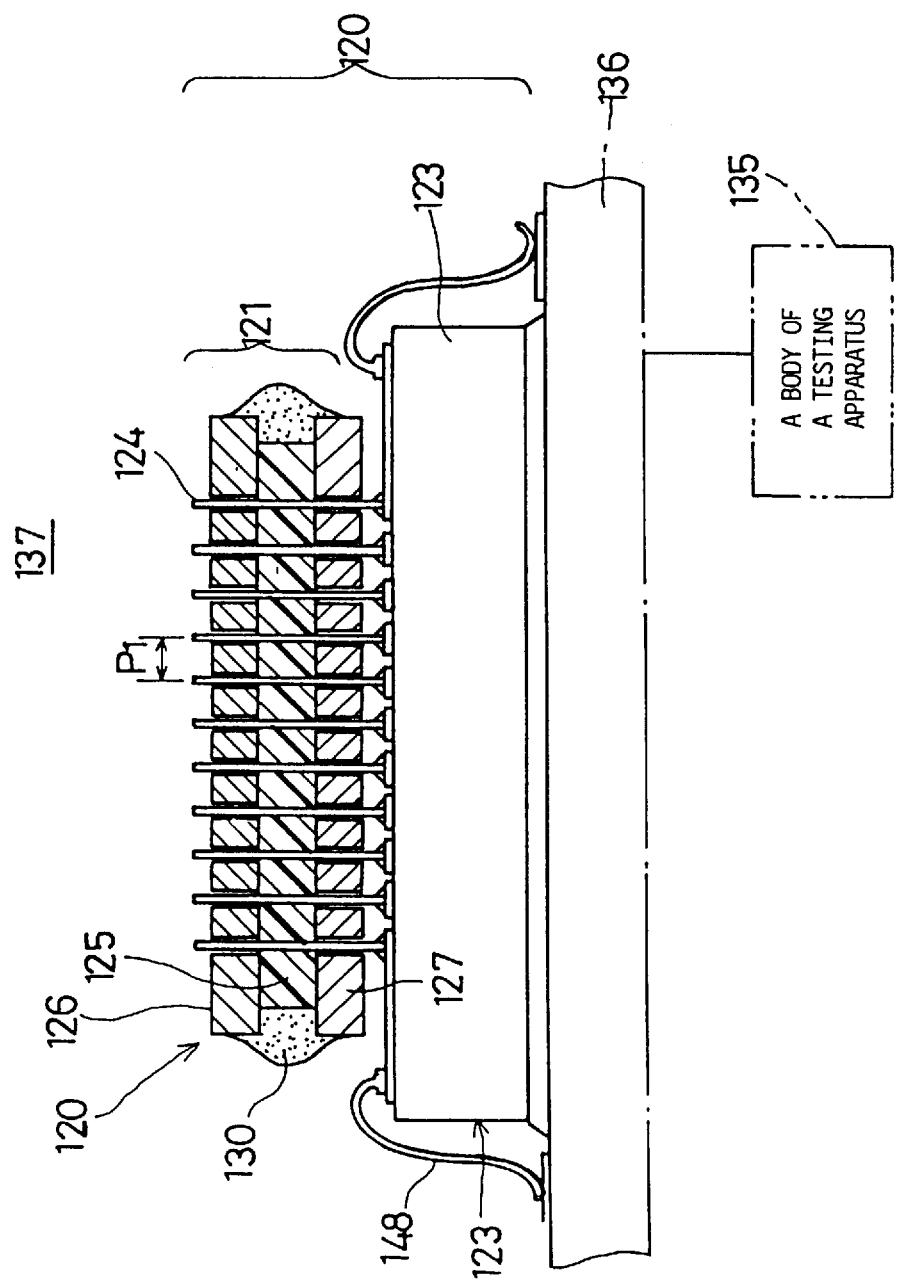
FIG. 16 shows a cross-sectional view of a second embodiment of a contact-probe device according to the present invention.
Figure 17:
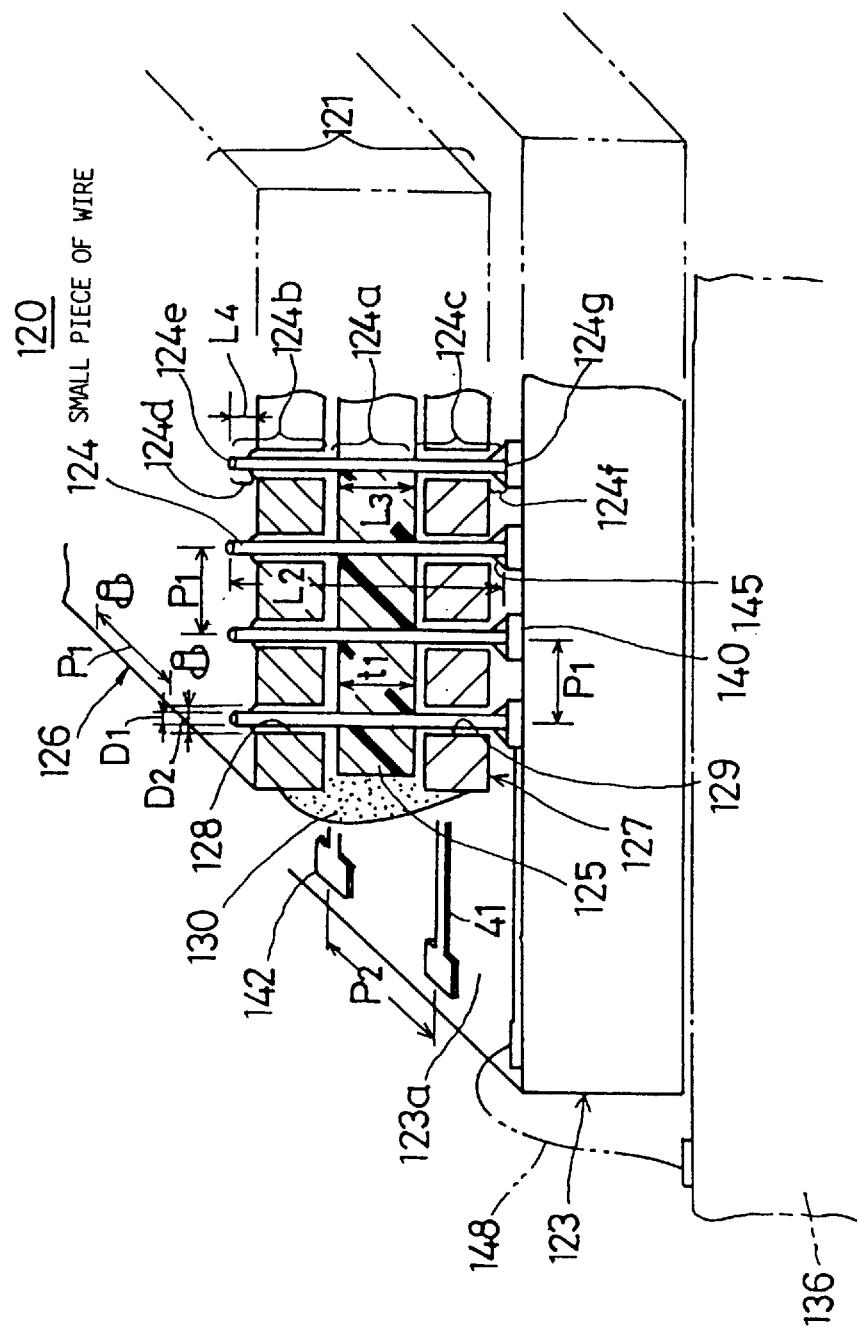
FIG. 17 shows a perspective view of a portion of the contact-probe device shown in FIG. 16.
Figure 18:
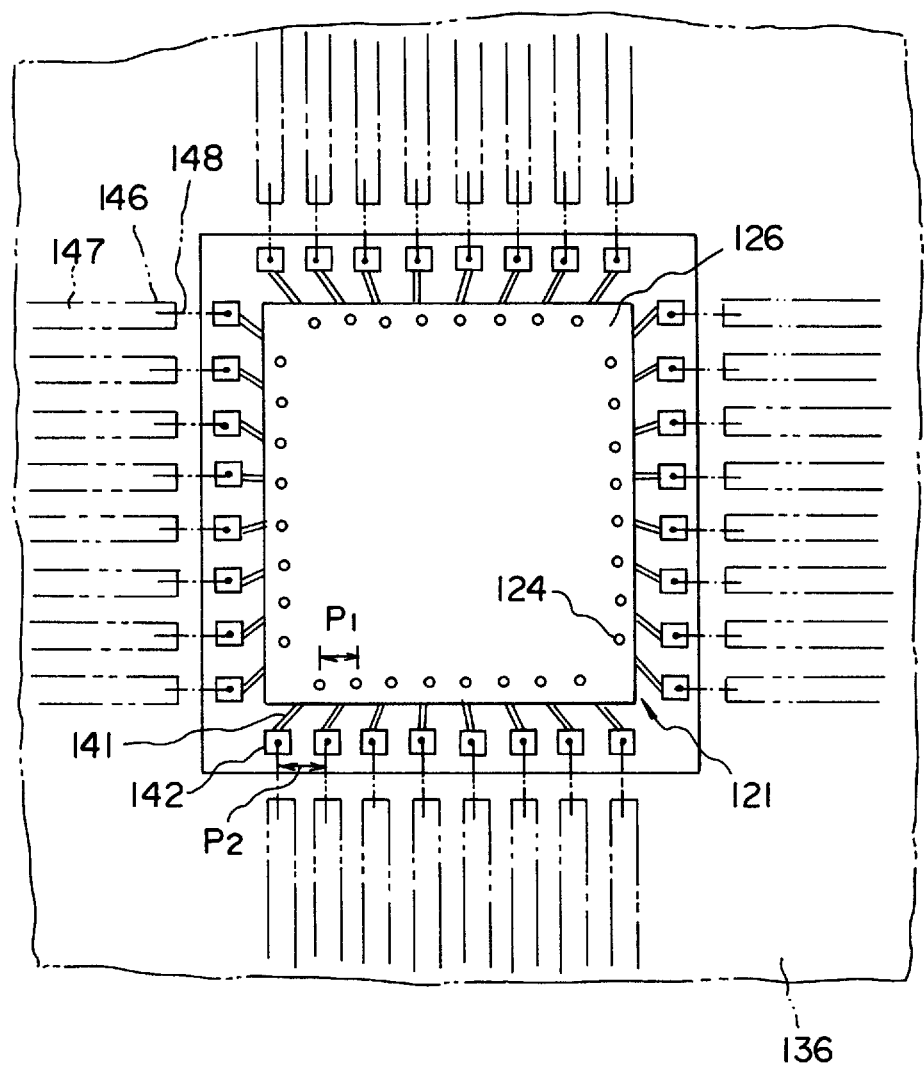
FIG. 18 shows a top-plan view of the contact-probe device shown in FIG. 16.

Next, a description will be given of a second embodiment of a contact-probe device according to the present invention, by referring to FIG. 16 to FIG. 18. FIG. 16 shows a cross-sectional view of the second embodiment of a contact-probe device 120 according to the present invention. FIG. 17 shows a perspective view of a portion of the contact-probe device shown in FIG. 16. FIG. 18 shows a top-plan view of the contact-probe device shown in FIG. 16.

A testing apparatus 137 shown in FIG. 16 is constructed with the contact-probe device 120 mounted on a motherboard 136 and a body of the testing apparatus 135. The body of the testing apparatus 135 is controlled by a computer (not shown), and the body of the testing apparatus 135 is connected with the motherboard 136.

The contact-probe device 120 is constructed with a contact-probe fabrication part 121 and a board 123. The contact-probe fabrication part 121 has a plurality of small pieces of wire 124, a sheet 125 made of silicone rubber, and two glass plates 126, 127. The two glass plates 126, 127 form an arrangement member. The glass plate 126 constitutes an upper-side plate member, and the glass plate 127 constitutes a lower-side plate member. The above-discussed contact-probe device 120 may be manufactured by fabricating the contact-probe fabrication part 121 and mounting the contact-probe fabrication part 121 on the board 123.

The plurality of small pieces of wire 124 form contact probes, and are made of, for example, Cu, BeCu, TiNi. The small piece of wire 124 may have a size of, for example, a diameter D1 of approximate 0.05 mm, and a length L2 of approximate 5 mm.

The small pieces of wire 124 respectively penetrate through the sheet 125. As shown in FIG. 17, a central part 124a of each wire 124 is fixed to the sheet 125. The small pieces of wire 124 are arranged in arrangement and pitch corresponding to the arrangement of a plurality of electrodes 115 (later shown in FIG. 19) of a semiconductor chip 112 (semiconductor device) to be tested. Further, each small piece of wire 124 penetrates from the sheet 125 in upper and lower directions. An upper exposed part 124b indicates a part exposed from the sheet 125 in the upward direction, and a lower exposed part 124c indicates a part exposed from the sheet 125 in the downward direction.

The sheet 125 made of the silicone rubber may have a size of a thickness t1 of, for example, approximately 4 mm. Since the silicone rubber is soft, the sheet 125 does not obstruct the small pieces of wire 124 from elastically bending. Therefore, as discussed later, the central part 124a of the small piece of the wire 124 may elastically bend.

A length L3 of the central part 124a of the small piece of wire 124 corresponds to the thickness t1 of the sheet 125. The length L3 of the central part 124a (the thickness t1 of the sheet 125) is set to, for example, 4 mm. By this length, the central part 124a may easily and elastically bend when a force is applied to the small piece of wire 124 in its axial direction.

A configuration that the plurality of small pieces of wire 124 penetrate through the sheet 125 may be manufactured as follows: for example, first, a plurality of wires are fixed in an arrangement, and are enveloped by the silicone rubber; second, the wires enveloped by the silicone rubber are sliced in a perpendicular direction of the wires into sections; and third, each sliced section is etched, and a portion of the silicone rubber is melted to expose a portion of the wires.

The glass plates 126, 127 respectively have a plurality of through holes 128, 129. The through holes 128, 129 respectively have diameters D2 larger than 0.1 mm, and are arranged in arrangement and pitch p1 corresponding to the arrangement of electrodes 115 of the semiconductor chip 112.

The glass plate 126 is provided on an upper side of the sheet 125 so that the upper exposed part 124b of the small piece of wire 124 is inserted in the through hole 128. The upper exposed part 124b penetrates through the through hole 128, and a portion 124d of the upper exposed part 124b is further exposed from the glass plate 126. A length L4 of the exposed part 124d is set to, for example, approximately 0.25 mm. A numeral "124e" indicates a top end of the small piece of wire 124 (the exposed part 124d).

On the other hand, the glass plate 127 is provided on a lower side of the sheet 125 so that the lower exposed part 124c of the small piece of wire 124 is inserted in the through hole 129. The lower exposed part 124c penetrates through the through hole 129, and a portion 124f of the lower exposed part 124c is further exposed from the glass plate 127 in its downward direction. A numeral "124g" indicates a bottom end of the small piece of wire 124 (the exposed part 124f). The above-discussed glass plates 126, 127 are adhered to each other through a synthetic resin part 130, and are fixed while sandwiching the sheet 125.

The board 123 has a size larger than that of the above-discussed sheet 125 and glass plates 126, 127. In a central part of an upper face 123a of the board 123, a plurality of electrodes 140 are provided. The electrodes 140 are arranged in the arrangement and pitch p1 corresponding to the arrangement of the electrodes 115 of the semiconductor chip 112.

Further, on the upper face of the board 123, as shown in FIG. 18, wiring patterns 141 externally extending from respective electrodes 140 in a radiating form, and electrodes 142 of top ends of the wiring patterns 141 which are used for being connected with external circuits are provided. A pitch p2 of the electrodes 142 for the external connection is set to relatively larger than the pitch p1 of the above-discussed electrodes 140 so as to easily carry out a wire-bonding operation.

The bottom ends 124g of the small pieces of wire 124 are respectively soldered to the electrodes 140 in the board 123 by solder parts 145. Therefore, the contact-probe fabrication part 121 may be fixed to the board 123 so as to be mounted on the board 123. In addition, the small pieces of wire 124 stand on the board 123 while electrically being connected to the electrodes 140.

With respect to the configuration of the contact-probe fabrication part 121, as previously discussed, the bottom ends 124g of the small pieces of wire 124 are positioned by the glass plate 127, and are arranged in the pitch p1. Therefore, when the contact-probe fabrication part 121 is provided on the board 123, all bottom ends 124g of the small pieces of wire 124 are oriented together to the electrodes 140 formed on the board 123. Accordingly, the bottom ends 124g of the small pieces of wire 124 may be soldered together with the electrodes 140 on the board 123. As a result, a soldering process may easily be carried out with high reliability.

The upper exposed parts 124b of the small pieces of wire 124 are positioned by the through holes 128 of the glass plate 126, and the exposed length L4 exposed from the glass 126 in the upward direction is relatively short, approximately 0.25 mm. Therefore, regardless of pitch precision when the small pieces of wire 124 are only penetrated through the sheet 125 without the glass plates 126, 127, the pitch of the top end parts 124e may precisely be determined to the pitch p1.

Accordingly, since the top ends parts 124e are positioned by the through holes 128 of the glass plate 126, the pitch of the small pieces of wire 124 may easily be determined with high precision, and, thus, the contact-probe device 120 may easily be manufactured as compared to the prior-art device.

Further, as shown in FIG. 16, the contact-probe device 120 is installed on the motherboard 136 in an exchangeable form. The electrodes 142 for external connection in the board 123 are electrically connected with electrodes 146 in the motherboard 136 through bonding wires 148. From the electrodes 146, wiring patterns 147 extend in the radiating form and reach electrodes (not shown) for external connection arranged in an outer direction in the motherboard 136. The motherboard 136 is connected with the body of the testing apparatus 135 through those electrodes for external connection.

Figure 19:
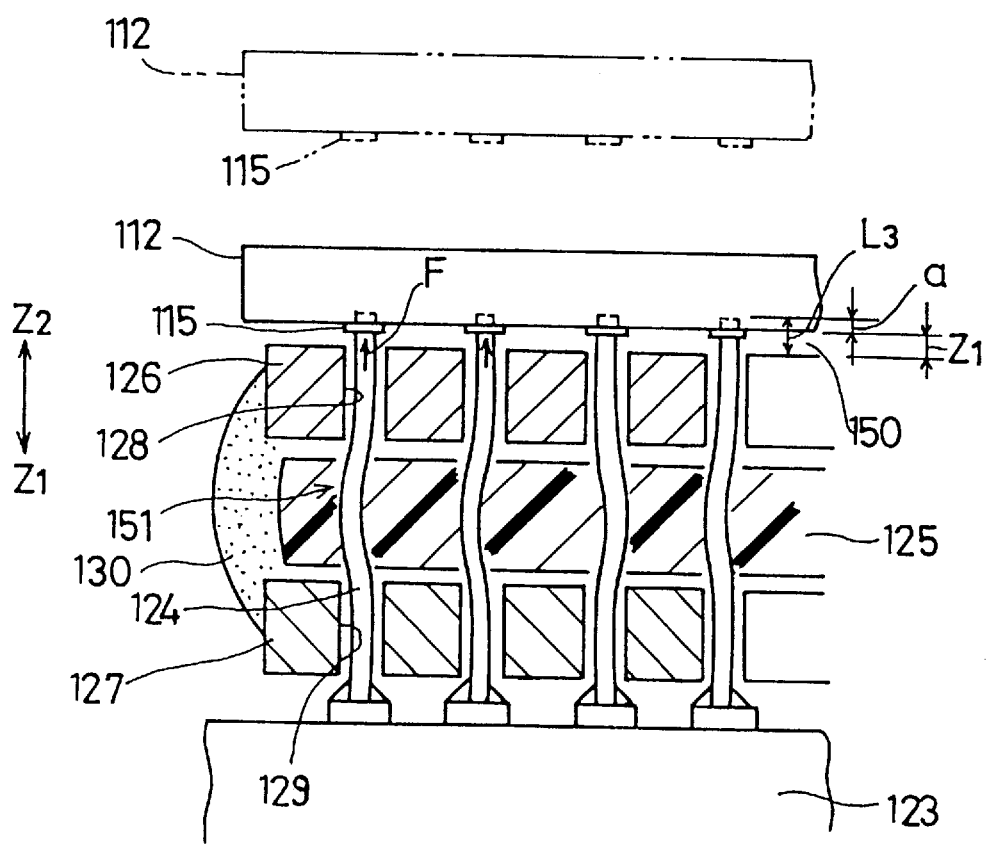
FIG. 19 shows an illustration for explaining a condition when the contact-probe device shown in FIG. 17 is pushed to a semiconductor chip to be tested.

Next, a description will be given of a condition when the contact-probe device 120 is pushed to the semiconductor chip 112 to be tested, by referring to FIG. 19. FIG. 19 shows an illustration for explaining the condition when the contact-probe device 120 shown in FIG. 17 is pushed to the semiconductor chip 112 to be tested.

For a pushing process, first, a relative position between the contact-probe device 120 and the semiconductor chip 112 is determined. Next, the contact-probe device 120 and the semiconductor chip 112 are moved toward each other until a distance 150 between the contact-probe device 120 and the semiconductor chip 112 becomes a given size z1. The given size z1 is shorter than the length L4 of the exposed part 124d by size a.

Since the pitch of the top end parts 124e of all the small pieces of wire 124 is precisely maintained at p1, when the contact-probe device 120 and the semiconductor chip 112 are moved toward each other, the top end parts 124e of all the small pieces of wire 124 may contact with the corresponding electrodes 115 of the semiconductor chip 112 without even one of the small pieces of wire 124 being outside of the electrodes 115 of the semiconductor chip 112.

In a process after that condition until the contact-probe device 120 and the semiconductor chip 112 are moved toward each other at final distance, a force in the axial direction is applied to the top end parts 124e of the small pieces of wire 124, and the small pieces of wire 124 are bent.

In this case, since portions of the small pieces of wire 124 within the through holes 128, 129 of the glass plates 126, 127 are restricted by inner walls of the through holes 128, 129, the portions within the through holes 128, 129 are not bent. On the contrary, since a portion (the central part 124a of the length L3) of the small piece of wire 124 which is positioned between the glass plates 126, 127 penetrates through the sheet 125 made of the silicone rubber, that portion (central part 124a) may be bent and changed as shown by a numeral "151". The bending of the central part 124a is carried out by compressing and extending the sheet 125 made of the silicone rubber. The silicone-rubber-made sheet 125 also operates so as to prevent the bent parts 151 from contacting and shorting with each other.

The above-discussed sizes, z1, L3, a, etc., are determined so that a degree of the bent part 151 in the central part 124a of the small piece of wire 124 does not exceed an elasticity limitation. Therefore, when the contact-probe device 120 and the semiconductor chip 112 are moved toward to each other at the final distance, the central part 124a of the small piece of wire 124 is bent within the elasticity limitation as shown in the bent part 151.

When the bent part is restored to its original state, the top end parts 124e of the small pieces of wire 124 push the corresponding electrodes 115 of the semiconductor chip 112 with a force F which is generated by an elastic power stored in the small pieces of wire 124. Therefore, the electrical connections between the small pieces of wire 124 of the contact-probe device 120 and the electrodes 115 of the semiconductor chip 112 may positively be performed.

As previously shown, a part of the small piece of wire 124 adjacent to the top end part 124e is inserted in the through hole 128 of the glass plate 126. Therefore, when the top end part 124e is pushed to the semiconductor chip 112, the part of the small piece of the wire 124 adjacent to the top end part 124e is led and moved in a downward direction by the through hole 128. Namely, the top end part 124e is slightly shifted in a downward direction (namely, in a direction represented by a symbol "Z1"). Accordingly, when the top end part 124e is shifted in the downward direction, the top end part 124e is prevented from horizontally being shifted and moving out of the electrode 115.

Further, since the part of the small piece of wire 124 adjacent to the top end part 124e is led by the through hole 128, the elastic power stored in the small piece of wire 124 operates in an upward direction of the top end part 124e (namely, in a direction represented by a symbol "Z2") when the bent part is restored. Also from this operation, the top end part 124e is prevented from horizontally being shifted and moving out of the electrode 115. Therefore, even if the electrode 115 is small in size, the small pieces of wire 124 of the contact-probe device 120 and the electrodes 115 of the semiconductor chip 112 are electrically connected with high reliability.

In this way, the semiconductor chip 112 is connected to the testing apparatus 135 shown in FIG. 17 through the contact-probe device 120, and the semiconductor chip 112 is tested by the testing apparatus 135.

Since each small piece of wire 124 stands straight on the board 123, the length L2 of the small piece of wire 124 may be relatively short, approximately 5 mm, as compared to the length L1 of the pin 114 of the prior-art contact-probe device 110. Therefore, inductance of the small piece of wire 124 may be extremely reduced as compared to the prior art. Further, even if a higher frequency signal is transmitted through the small piece of wire 124, an influence of the inductance of the small piece of wire 124 may be negligible. Therefore, even if a frequency of the signal used in the semiconductor chip increases as compared to the prior art, the characteristics of the semiconductor chip 112 may regularly be tested.

In addition, since the length L2 of all the small pieces of wire 124 are adjusted to the same short length, unbalance of the length L2 of the small pieces of wire 124 may not occur to influence the test. Also from these advantages, a characteristics test of the semiconductor chip 112 may precisely be performed.

Figure 20:
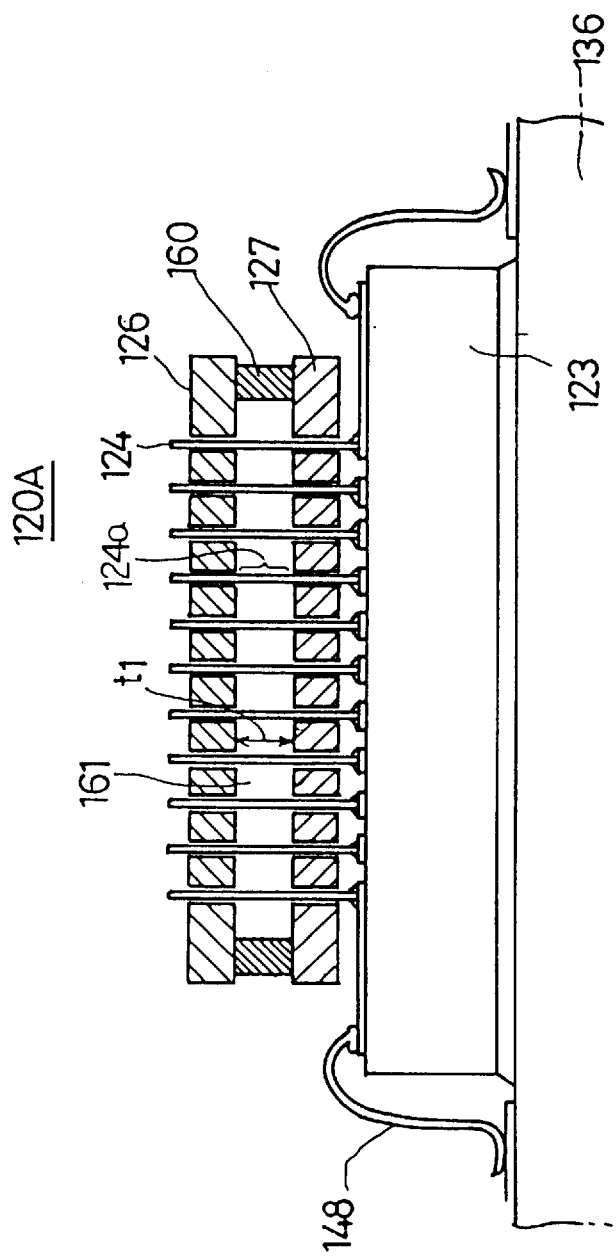
FIG. 20 shows a cross-sectional view of a third embodiment of a contact-probe device according to the present invention.

FIG. 20 shows a cross-sectional view of a third embodiment of a contact-probe device according to the present invention. Elements in FIG. 20 which are the same as those of FIG. 16 are given the same reference numerals.

In a contact-probe device 120A according to the present invention shown in FIG. 20, as compared to the second embodiment of the contact-probe device 120 mentioned above, the silicone-rubber sheet 125 is eliminated. Instead, a supporting frame 160 which is shaped in a rectangular form is sandwiched between the two glass plates 126, 127, and is fixed so that a space 161 having a thickness t1 is formed between the glass plates 126, 127. In the configuration, the central part 124a of the small piece of wire 124 is positioned within the space 161.

Figure 21:
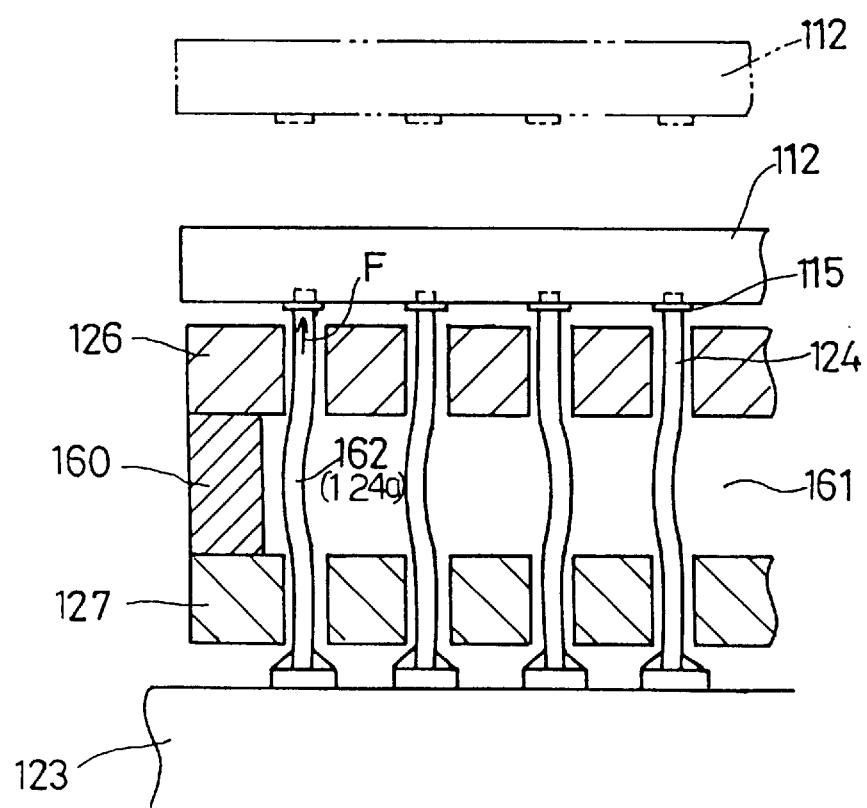
FIG. 21 shows an illustration for explaining a condition when the contact-probe device shown in FIG. 20 is pushed to the semiconductor chip to be tested.

FIG. 21 shows an illustration for explaining a condition when the contact-probe device 120A shown in FIG. 20 is pushed to the semiconductor chip 112 to be tested. When the contact-probe device 120A is pushed to the semiconductor chip 112, the central part 124a of the small piece of wire 124 positioned within the space 161 is bent within the elasticity limitation in the space 161 as shown in a numeral "162". Further, by the elastic power by which the bent part is restored to the original state, the top end part 124e of each small piece of wire 124 pushes the corresponding electrode 115 of the semiconductor chip 112 with the force F.

Therefore, in the configuration of the third embodiment of the contact-probe device 120A, the small pieces of wire 124 are bent within the space 161 and the upper and lower parts of each small piece of wire 124 are supported by the glass plates 126, 127. Thus, the third embodiment of the contact-probe device 120A may realize the same effect as that of the second embodiment of the contact-probe device 120.

Figure 22A:
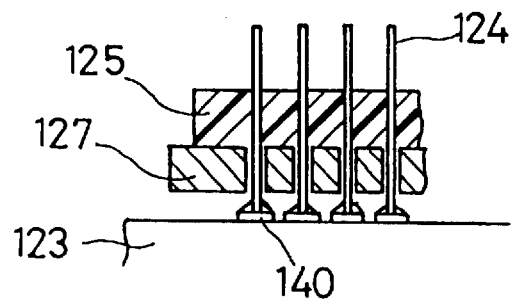
FIG. 22A to FIG. 22C show a method of manufacturing the contact-probe device 120A shown in FIG. 20.
Figure 22B:
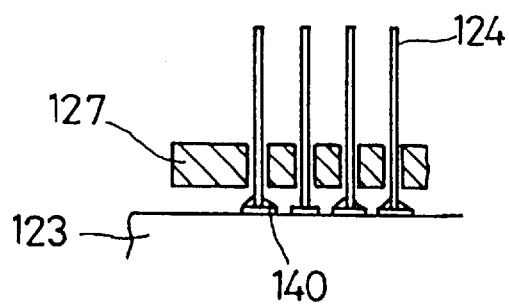
Figure 22C:
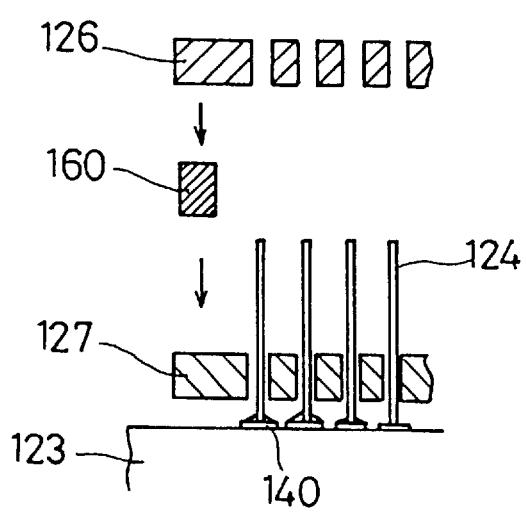

FIG. 22A to FIG. 22C show a method of manufacturing the contact-probe device 120A shown in FIG. 20.

First, as shown in FIG. 22A, in the condition in that the small pieces of wire 124 penetrate through the sheet 125, and the glass plate 127 is provided under the sheet 125, the bottom end parts of the small pieces of wire 124 are soldered to the electrodes 140 formed on the board 123.

Second, as shown in FIG. 22B, the sheet 125 is pulled and eliminated.

Third, as shown in FIG. 22C, the supporting frame 160 having the rectangular shape and the glass plate 126 are overlapped and fabricated to manufacture the contact-probe device 120A.

Figure 23:
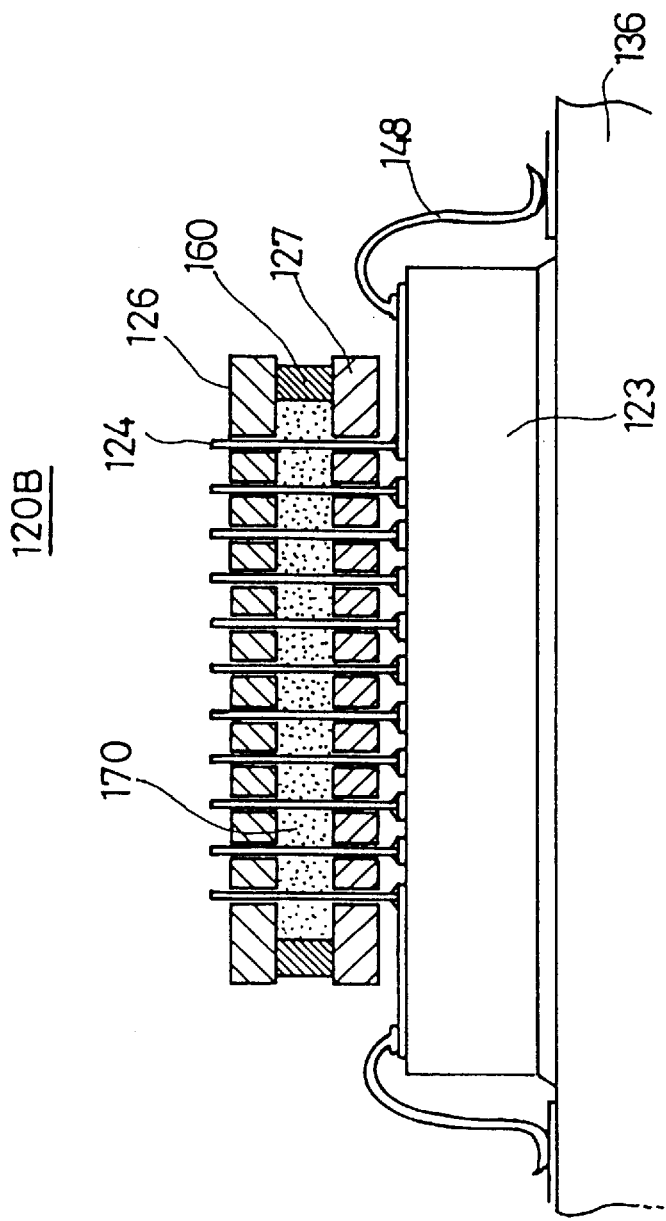
FIG. 23 shows a cross-sectional view of a fourth embodiment of a contact-probe device according to the present invention.

Next, a description will be given of a fourth embodiment of a contact-probe device according to the present invention. FIG. 23 shows a cross-sectional view of the fourth embodiment of the contact-probe device according to the present invention. Elements in FIG. 23 which are the same as those of FIG. 20 are given the same reference numerals.

In a contact-probe device 120B according to the present invention shown in FIG. 23, as compared to the third embodiment of the contact-probe device 120A mentioned above, the space 161 is filled with a silicone rubber 170. In the configuration, when the small pieces of wire 124 are bent, the adjacent small pieces of wire 124 are positively prevented from being shorted to each other.

Next, a description will be given of a fifth embodiment of a contact-probe device according to the present invention. FIG. 24 shows a cross-sectional view of the fifth embodiment of the contact-probe device according to the present invention. Elements in FIG. 24 which are the same as those of FIG. 20 are given the same reference numerals.

In a contact-probe device 120C according to the present invention shown in FIG. 24, as compared to the third embodiment of the contact-probe device 120A mentioned above, the supporting frame 160 having the rectangular shape and the lower-side glass plate 127 are removed, and only the upper-side glass plate 126 remains. In the contact-probe device 120C, the configuration of the contact-probe device may be simplified, and substantially the same effect as that of the second embodiment of the contact-probe device 120A may be realized.

Next, a description will be given of a sixth embodiment of a contact-probe device according to the present invention. FIG. 25 shows a cross-sectional and perspective view of the sixth embodiment of the contact-probe device according to the present invention. In a contact-probe device 120D according to the present invention shown in FIG. 25, the bottom end parts 124g of the small pieces of wire 124 are not soldered to the electrodes 140 formed on the board 123, and merely contact the electrodes 140.

The contact-probe device 120D is constructed with the contact-probe fabrication part 121 having the same configuration as shown in FIG. 17, the board 123, and a positioning frame 180 fixed on the board 123. The positioning frame 180 has a rectangular shape and has the same size as that of the contact-probe fabrication part 121.

The contact-probe fabrication part 121 is adjusted to the positioning frame 180 and put inside the positioning frame 180. The position of the contact-probe fabrication part 121 is restricted by the positioning frame 181. Whereby, the bottom end part 124g of each small piece of wire 124 is contacted with the corresponding electrode 140 formed on the board 123, and, thus, the contact-probe fabrication part 121 is electrically connected to the board 123.

According to the sixth embodiment of the contact-probe device 120D, if a plurality of contact-probe fabrication parts, which have different arrangements of the small pieces of wire and have the same outside size, are prepared, the contact-probe fabrication part may be exchanged according to an object to be tested.

Figure 26A:
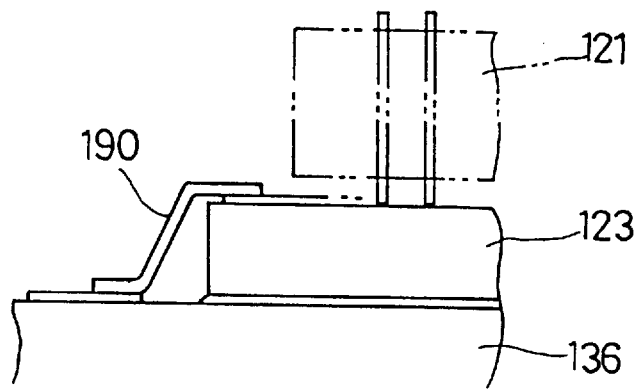
FIG. 26A and FIG. 26B show modifications of an electrical connection of a board and a motherboard.
Figure 26B:
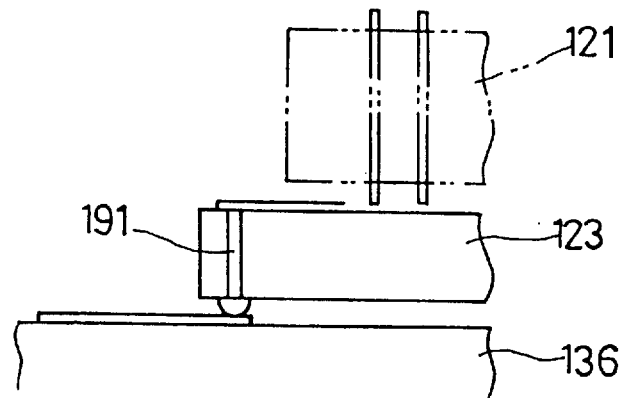

FIG. 26A and FIG. 26B show modifications of the electrical connection of the board 123 and the motherboard 136. As shown in FIG. 26A, the electrical connection of the board 123 and the motherboard 136 may be realized through a gull-wing-shaped lead 190. Further, as shown in FIG. 26B, the electrical connection of the board 123 and the motherboard 136 may be realized by using a through hole 191.

In the above-discussed second to sixth embodiments of the contact-probe devices, the configurations in which the contact-probe devices are used for the test of the semiconductor chip have been shown. However, the object to be tested by using the contact-probe device according to the present invention is not limited to the semiconductor chip, but may be, for example, a ball-grid-array-type semiconductor device.

In addition, if a plurality of contact-probe devices such as a contact-probe device for the semiconductor chip and a contact-probe device for the semiconductor device are prepared, the contact-probe device may be exchanged on the motherboard 136 according to the object to be tested without exchanging the motherboard 136.

Figure 27:
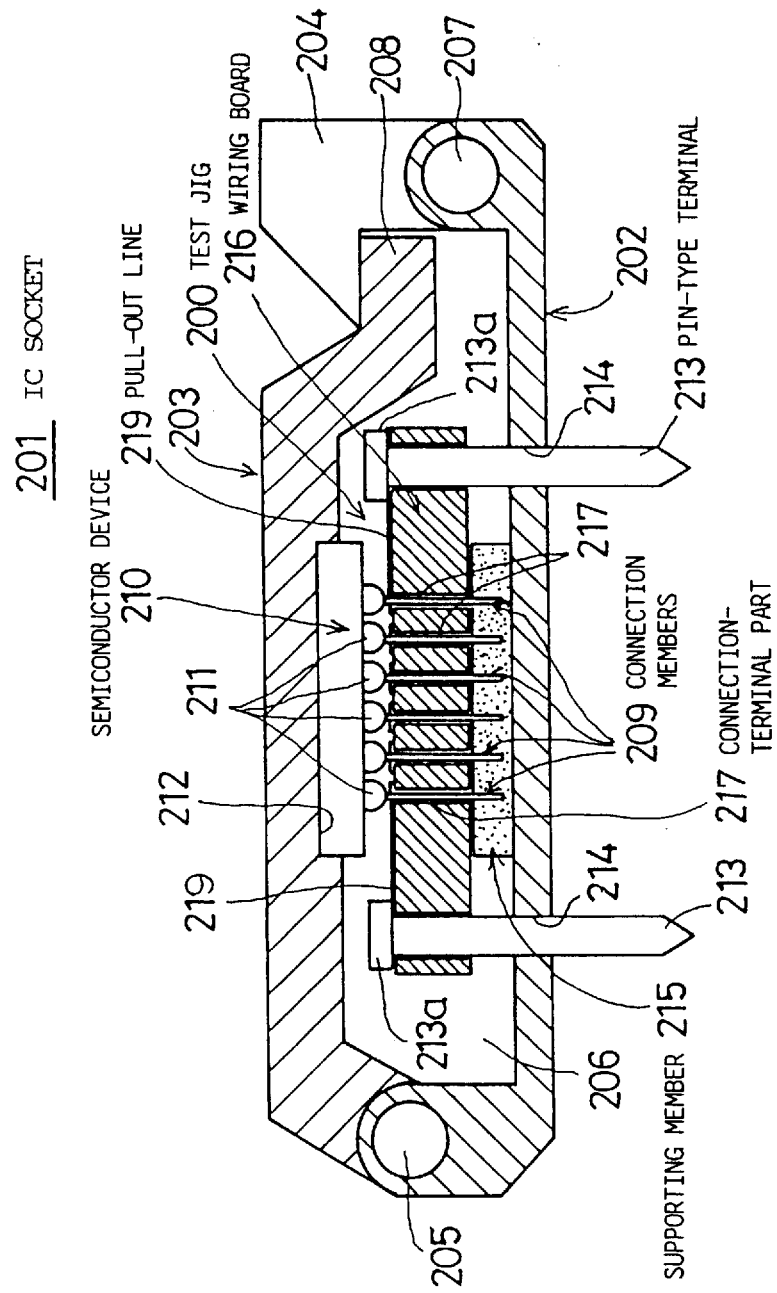
FIG. 27 shows a cross-sectional view of an IC socket using a seventh embodiment of a test jig for a semiconductor device according to the present invention.

Next, a description will be given of a seventh embodiment of a test jig for a semiconductor device according to the present invention. FIG. 27 shows a cross-sectional view of an IC socket using the seventh embodiment of the test jig for the semiconductor device according to the present invention. An IC socket 201 shown in FIG. 27 includes a socket body 202, a lid part 203, a lock part 204, and a test jig 200.

The socket body 202 and the lid part 203 are formed by insulating resin. The lid part 203 is installed in the socket body 202 so that the lid part 203 can rotate about an axis 205 provided in one side of the socket body 202. Further, the socket body 202 and the lid part 203 are configurated so as to generate a space part 206 between the socket body 202 and the lid part 203 when the lid part 203 is closed. Within the space part 206, the test jig 200 is provided. In addition, in the socket body 202, through holes 214 to be penetrated by pin-type terminals 213 arranged in the test jig 200 are formed.

Also in the other side of the socket body 202, an axis 207 is provided, and about the axis 207, the lock part 204 can rotate. A jaw part 208 formed in the lid part 203 can be locked with the lock part 204. When the lid part 203 is closed, the lock part 204 and the jaw part 208 are coupled with each other, and the lock part 204 locks the lid part 203 in a closed condition (FIG. 22 shows a condition in which the lid part 203 is closed).

As discussed later, the test jig 200 is constructed such that a semiconductor device 210 is provided over a plurality of wire-type connection members 209 arranged in the test jig 200 so as to be tested. In an outside bottom face of the semiconductor device 210, a plurality of bumps 211 for external terminals are formed, and the connection members 209 are electrically connected to the semiconductor device 210 by contacting the bumps 211.

Therefore, the semiconductor device 210 needs to be positioned with respect to the test jig 200 so that the connection members 209 contact the bumps 211. If the connection members 209 are shifted from the bumps 211, the test of the semiconductor device 210 may not precisely be performed. For that reason, in a given position of the lid part 203, a concave part 212 for positioning the semiconductor device 210 is provided. Therefore, by the semiconductor device 210 being put in the concave part 212 for the positioning, the position of the semiconductor device 210 in the IC socket 201 is prevented from being shifted, and, thus, a further precise test may be performed.

Figure 28:
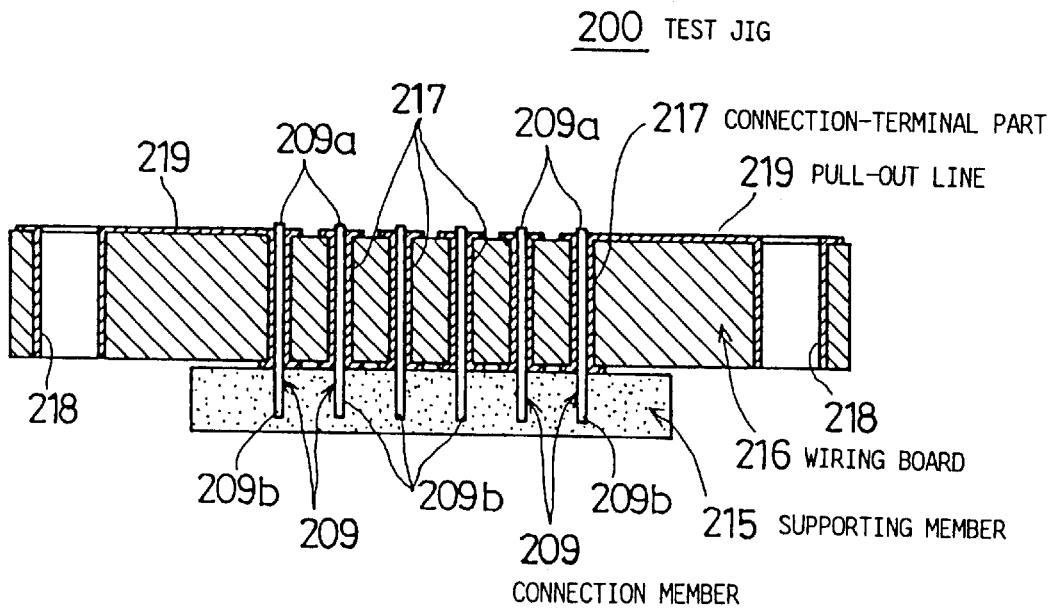
FIG. 28 shows an expanded view of the test jig shown in FIG. 27.

Next, a description will be given of a configuration of the test jig 200, by referring to FIG. 28 as well as FIG. 27. FIG. 28 shows an expanded view of the test jig 200 shown in FIG. 27. In the test jig 200 shown in FIG. 28, later-discussed pin-type terminals 213 are omitted.

The test jig 200 is substantially constructed with the connection members 209, a supporting member 215, and a wiring board 216. The connection members 209 are wire-type members made of, for example, Cu, BeCu, TiNi. As previously discussed, top end parts 209a of the connection members 209 contact the bumps 211 arranged on the semiconductor device 210 and are electrically connected to the semiconductor device 210. Further, when the connection members 209 are installed in the test jig 200, each connection member 209 is exposed from a top face of the wiring board 216 by a small part, whereby the electrical connection between the connection members 209 and the bumps 211 may be positively performed.

The supporting member 215 is made of a material having elasticity and insulation such as silicone rubber. Bottom end parts 209b of the connection members 209 are implanted and fixed in the supporting member 215. Therefore, a plurality of connection members 209 may stand supported by the supporting member 215. Arrangement of the plurality of connection members 209 in the supporting member 215 is adjusted so as to correspond to an arrangement of the bumps 211 formed on the semiconductor device 210.

For the wiring board 216, a glass-epoxy printed wiring board is used to reduce the cost. The wiring board 216 has insertion holes (which are formed so as to correspond to the arrangement of the bumps 211) into which the connection members 209 are inserted. An inside wall of each insertion hole is coated with conductive material to constitute a through-hole-type connection-terminal part 217.

Each connection member 209 is inserted into the insertion hole formed in the wiring board 216, and is electrically connected to the connection-terminal part 217. As discussed above, the connection members 209 are supported by the supporting member 215 so that the position arrangement of the connection members 209 corresponds to the position arrangement of the bumps 211 formed on the semiconductor device 210. Therefore, a plurality of the connection members 209 may be inserted together into the insertion holes formed in the wiring board 216. As a result, an inserting operation of the connection members 209 may easily be performed. Further, since the supporting member 215 is made of an insulating material, the plurality of connection members 209 are prevented from being shorted through the supporting member 215.

In an outer direction area in the wiring board 216, terminal-insertion holes 218 for insertion of the pin-type terminals 213 are formed. Further, on the upper face of the wiring board 216, pull-out lines 219 for pulling out the connection-terminal parts 217 to the outer direction area of the wiring board 216 are formed. The pull-out lines 219 are printed in the wiring board 216, and are pulled out to areas near the terminal-insertion holes 218. An inside wall of each terminal-insertion hole 218 is also coated with the conductive material to constitute a through hole. Further, the pull-out lines 219 and the connection-terminal parts 217 are integrated and electrically connected, and the pull-out lines 219 and the conductive films formed inside the terminal-insertion holes 218 are integrated and electrically connected.

The pin-type terminals 213 are inserted into the terminal-insertion holes 218, and are electrically connected with the pull-out lines 219. On a top end side of each pin-type terminal 213, a head part 213a having a larger diameter size as compared to the terminal-insertion hole 218 is provided. Therefore, when the pin-type terminal 213 is inserted into the terminal-insertion hole 218, the head part 213a may contact the pull-out line 219, and, thus, the electrical connection of the pin-type terminal 213 and the pull-out line 219 is also performed.

Figure 29:
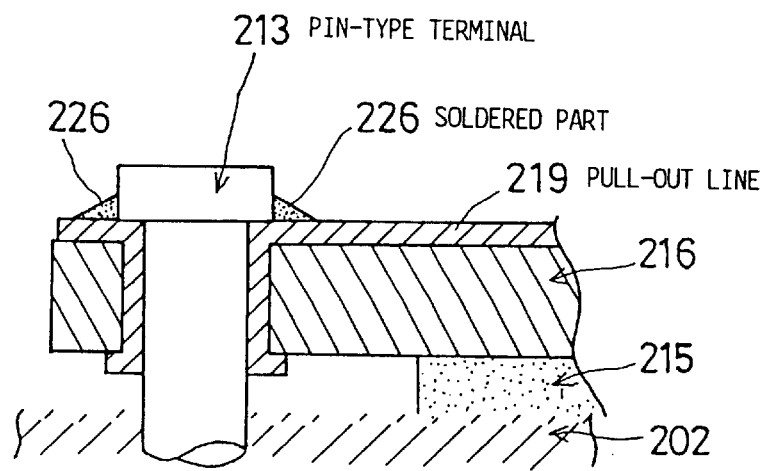
FIG. 29 shows an expanded view of a soldered part provided between a pin-type terminal and a pullout line shown in FIG. 27.
Figure 30:
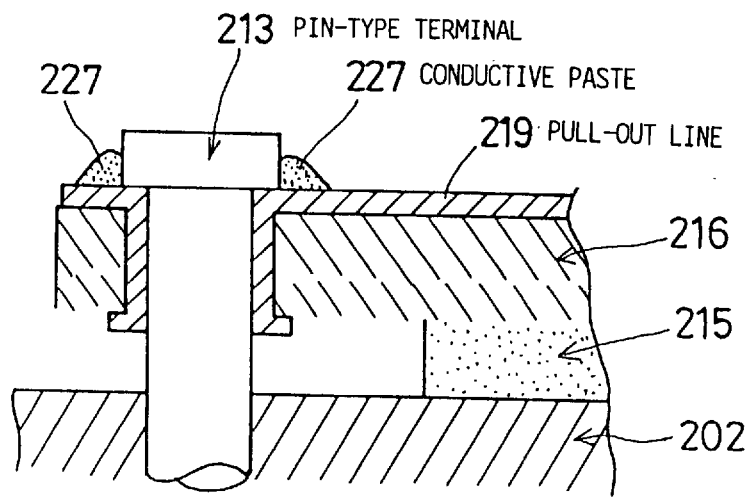
FIG. 30 shows an expanded view of a conductive material provided between the pin-type terminal and the pull-out line shown in FIG. 27.

In that case, to further positively perform the electrical connection of the pin-type terminal 213 and the pull-out line 219, as shown in FIG. 29, the head part 213a may be soldered with the pull-out line 219 (a soldered part is represented by a numeral "226"). Further, as shown in FIG. 30, conductive paste (conductive material) 227 may be applied between the pin-type terminal 213 and the pull-out line 219.

In this way, the pin-type terminal 213 is electrically connected to the pull-out line 219, and, thus, the pin-type terminal 213 may electrically be connected to the connection member 209 through the pull-out line 219 and the connection-terminal part 217.

In the test jig 200 according to the present invention, the top end parts 209a of the wire-type connection members 209 are electrically connected with the semiconductor device 210 by contacting the bumps 211 formed on the semiconductor device 210. In this case, since the connection members 209 are constituted with the wire-type members, the connection members 209 may be arranged close to each other. Therefore, for the semiconductor device 210 on which the bumps 211 of a micro-ball-grid array ($\mu$BGA) type, etc., are arranged with high density, the test jig 200 according to the present invention is applicable.

Since the supporting member 215 is made of the elastic material such as silicone rubber, each connection member 209 may shift in upward and downward directions by the supporting member 215 being elastically changed. Further, each connection member 209 may move in the upward and downward directions through the holes of the connection-terminal part 217 while maintaining the electrical connection with the connection-terminal part 217. Therefore, even if the length of the connection members 209 is dispersed due to a size error, etc., the connection members 209 may positively be connected to the bumps 211 of the semiconductor device 210. According to the above-discussed configuration, reliability of the semiconductor test may be improved.

Furthermore, in the wiring board 216 provided in the test jig 200 according to the present invention, the connection-terminal part 217 for electrically connecting with the connection member 209, and the pull-out line 219 for pulling out the connection-terminal part 217 to the pin-type terminal 213 are formed. Therefore, the electrical connection of the pin-type terminal 213 and the connection member 209 may be performed by using the wiring board 216, and, thus, the connection member 209 may be derived outside the test jig 200.

In the contact-probe device 120 shown in FIG. 16, since the small pieces of wire 124 (corresponds to the connection members 209 in this embodiment shown in FIG. 27) are respectively soldered to the board 123, it takes substantial time to perform the soldering process. In this case, as the arrangement pitch of the small pieces of wire 124 is narrowed, the above condition gets worse.

On the contrary, in the present embodiment, only by inserting the connection members 209 into the connection-terminal parts 217 formed in the connection board 216, the connection members 209 may be pulled out to the pin-type terminals 213. Therefore, a connection configuration of the connection members 209 and the wiring board 216 may be simplified. Further, even if the arrangement pitch of the connection members 209 is narrowed, the connection members 209 and the wiring board 216 are electrically connected only by inserting the connection members 209 into connection-terminal parts 217. Therefore, the test jig 200 according to the present invention may be adapted to the narrowed pitch configuration.

Figure 31:
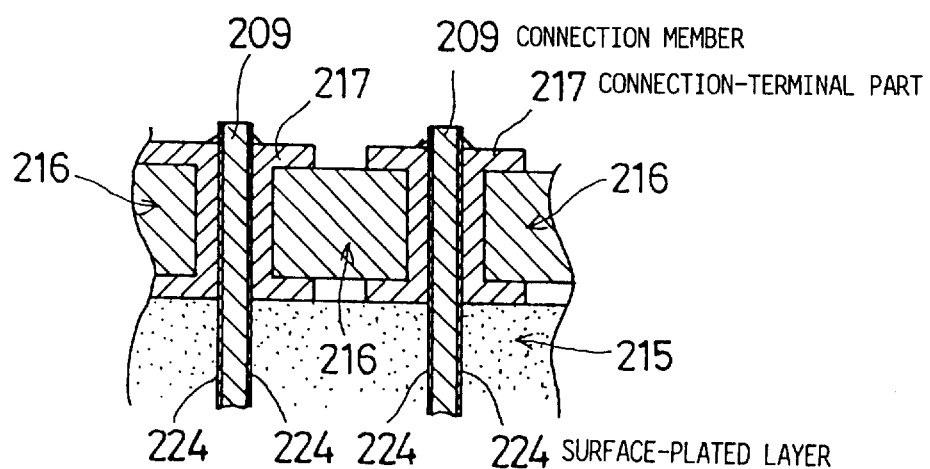
FIG. 31 shows an expanded view of a plated part provided between a connection member and a connection-terminal part shown in FIG. 27.

As discussed above, the connection members 209 may electrically connect with the connection-terminal parts 217 by inserting the connection members 209 into the connection-terminal parts 217 formed in the wiring board 216. Therefore, to further positively perform the electrical connection of the connection members 209 and the connection-terminal parts 217, as shown in FIG. 31, on a surface of each connection member 209, a surface-plated layer 224 may be formed by using solder, gold, etc.

Figure 32:
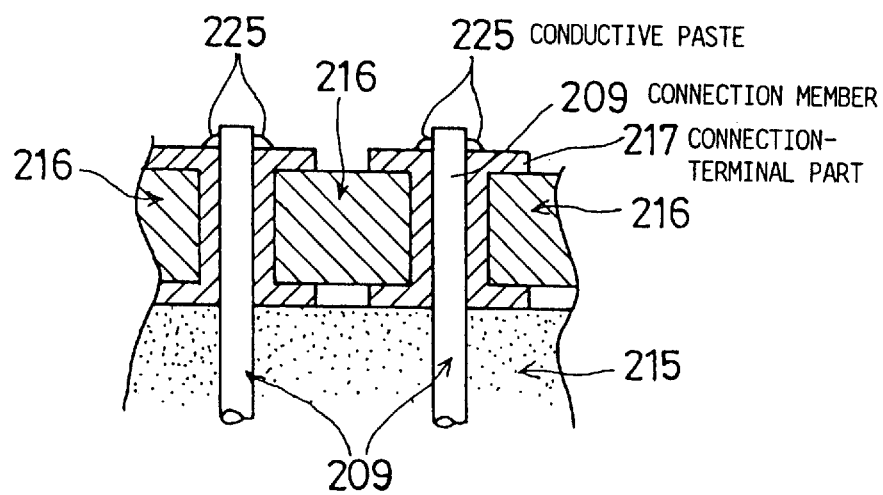
FIG. 32 shows an expanded view of a conductive material provided between the connection member and the connection-terminal part shown in FIG. 27.

Furthermore, as shown in FIG. 32, between an upper end part of each connection member 209 and the connection-terminal part 217, conductive paste (conductive material) 225 is applied, whereby the electrical connection of the connection member 209 and the connection-terminal part 217 may positively be ensured.

Figure 33:
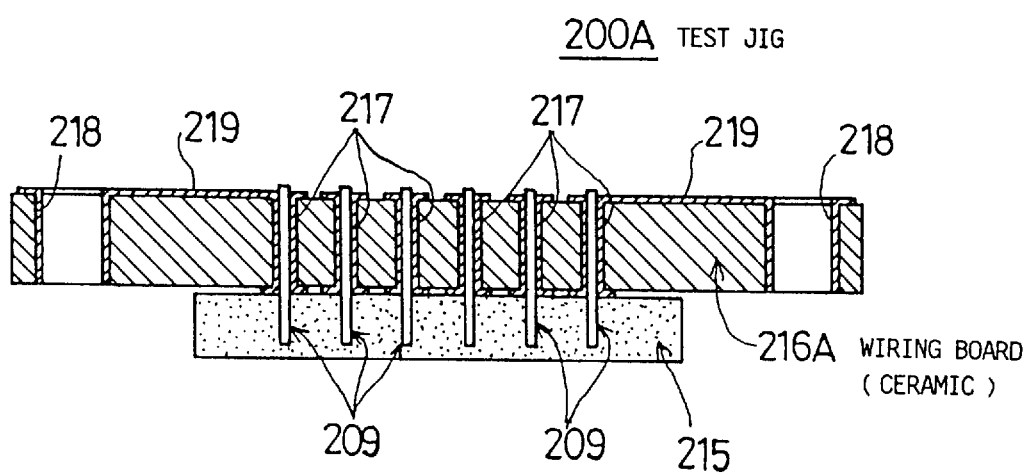
FIG. 33 and FIG. 34 show modifications of the seventh embodiment of the test jig according to the present invention shown in FIG. 27.
Figure 34:
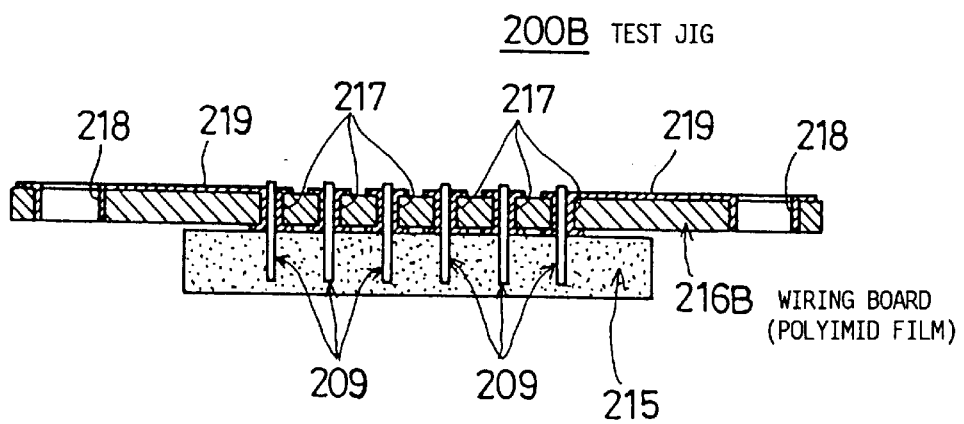

FIG. 33 and FIG. 34 show modifications of the seventh embodiment of the test jig according to the present invention shown in FIG. 27. Elements in FIG. 33 and FIG. 34 which are the same as those of FIG. 27 and FIG. 28 are given the same reference numerals.

In a test jig 200A shown in FIG. 33, a ceramic board is used for a basic material of a wiring board 216A. In a test jig 200B shown in FIG. 34, a polyimide-film board is used for a basic material of a wiring board 216B.

In this way, by using the ceramic board and polyimide-film board for the basic materials of the wiring boards 216A, 216B, the arrangement pitch of the connection members 209 may be narrowed. Therefore, the test jigs 200A, 200B are adaptable to the semiconductor device 210 formed with a high density.

Figure 35:
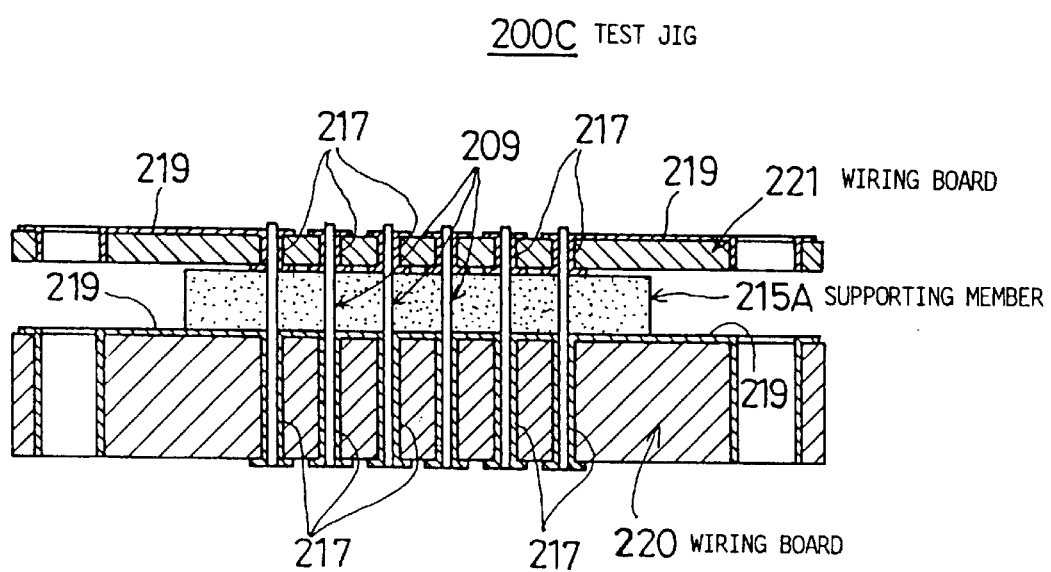
FIG. 35 shows a cross-sectional view of an eighth embodiment of a test jig for a semiconductor device according to the present invention.

FIG. 35 shows a cross-sectional view of an eighth embodiment of a test jig for a semiconductor device according to the present invention. Elements in FIG. 35 which are the same as those of FIG. 27 and FIG. 28 are given the same reference numerals.

In a test jig 200C shown in FIG. 35, two wiring boards 220, 221 are used, and a supporting member 215A is sandwiched between the two wiring boards 220, 221. In this embodiment, the wiring board 220 has the same configuration as that of the wiring board 216 shown in FIG. 27, FIG. 28, and uses the glass-epoxy board. The wiring board 221 has the same configuration as that of the wiring board 216B shown in FIG. 34, and uses the polyimide-film board.

Further, in this embodiment, the supporting member 215A is provided between a pair of wiring boards 220, 221, and the connection members 209 are formed such that central part of each connection member 209 is supported by the supporting member 215A. In addition, each connection member 209 penetrates through the connection-terminal parts 217 formed in both the wiring boards 220 and 221.

According to the eighth embodiment of the test jig 200C, a plurality of wiring boards 220, 221 are arranged in a stack form. Therefore, a position arrangement of the pull-out lines 219 formed in the wiring boards 220, 221 may flexibly be determined. Accordingly, the arrangement pitch of the connection part may be narrowed.

In further detail, as compared to the test jig which is constructed with a single wiring board, the present embodiment may reduce the number of the pull-out lines 219 formed in the wiring boards 220, 221 to one-half. Therefore, the position of the pull-out lines 209 may flexibly be arranged.

Figure 36:
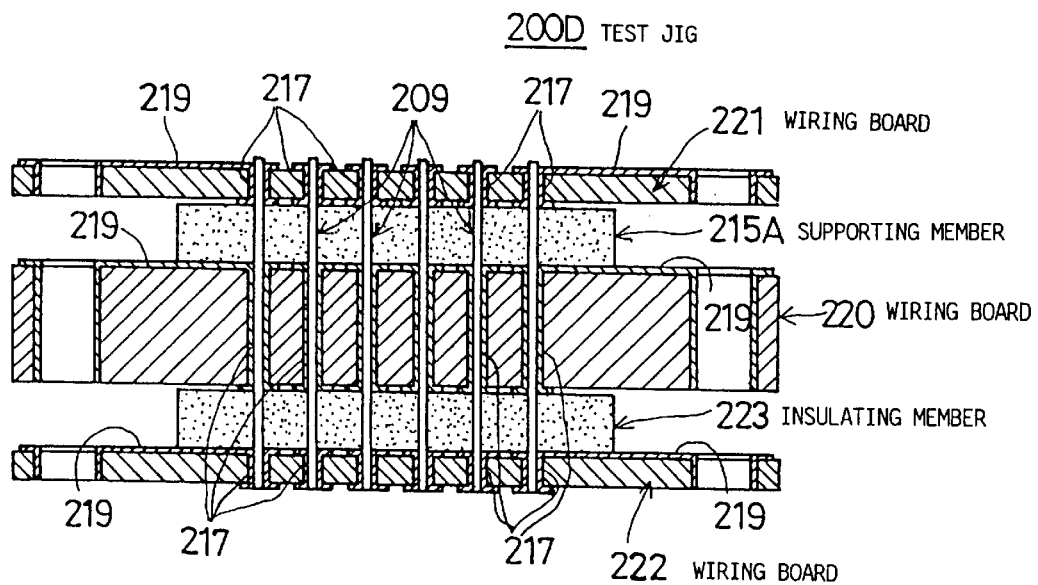
FIG. 36 shows a cross-sectional view of a ninth embodiment of a test jig for a semiconductor device according to the present invention.

FIG. 36 shows a cross-sectional view of a ninth embodiment of a test jig for a semiconductor device according to the present invention. Elements in FIG. 36 which are the same as those of FIG. 35 are given the same reference numerals.

In a test jig 200D shown in FIG. 36, a wiring board 222 is layered under the test jig 200C shown in FIG. 35, and, thus, a total of three wiring boards 220 to 222 are layered. Further, between the wiring board 220 and the wiring board 222, an insulating member 223 is sandwiched.

In this embodiment, the wiring board 222 has the same configuration as that of the wiring board 216B shown in FIG. 34, and uses the polyimide-film board. The insulating member 223 has the same configuration as that of the supporting member 215A shown in FIG. 35. The connection members 209 are constructed such that the upper part of each connection member 209 is supported by the supporting member 215A and the lower part thereof is supported by the insulating member 223. Further, each connection member 209 penetrates through the connection-terminal parts 217 formed in all the wiring boards 220 to 222.

According to the ninth embodiment of the test jig 200D, between the wiring board 220 and the wiring board 222, the insulating member 223 for the connection members 209 to penetrate therethrough is sandwiched. Therefore, the connection-terminal parts 217 and the pull-out lines 219 formed in the wiring boards 220, 222 are prevented from being shorted between the wiring boards 220, 222 (this function is provided also in the supporting members 215, 215A). Further, since the insulating member 223 has a function of supporting the connection members 209, a mechanical strength of the connection members 209 may also be improved.

In the above-discussed eighth and ninth embodiments of the test jig, two or three wiring boards are layered, and only one insulating member 223 is provided. However, the number of the wiring boards is not limited to the above number, but a larger number of wiring boards are usable. Further, a plurality of insulating members are also usable according to the number of the wiring boards.

Figure 37:
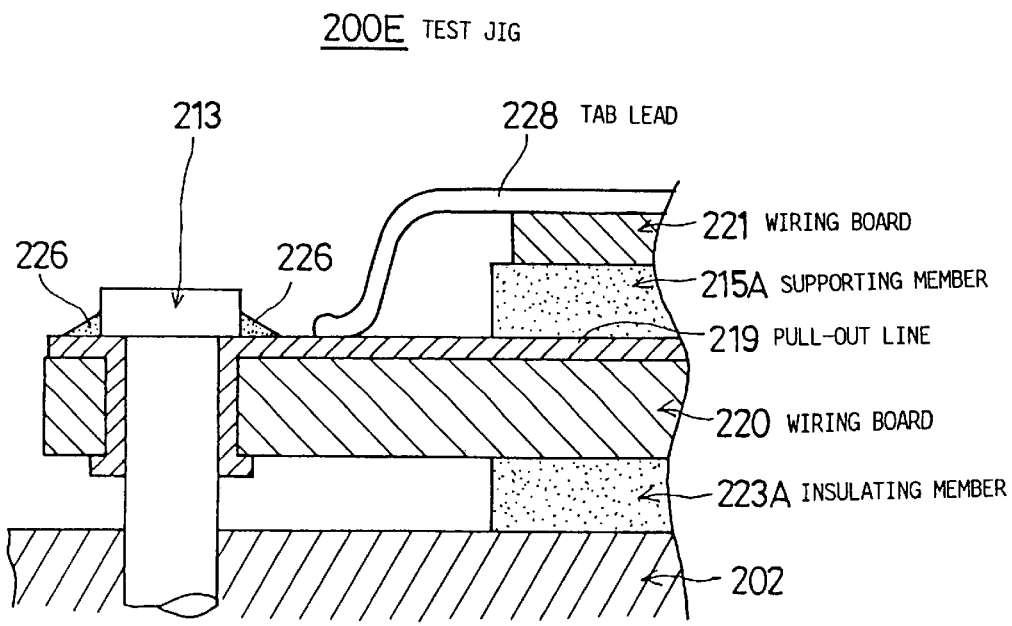
FIG. 37 shows a cross-sectional view of a tenth embodiment of a test jig for a semiconductor device according to the present invention.

FIG. 37 shows a cross-sectional view of a tenth embodiment of a test jig for a semiconductor device according to the present invention. Elements in FIG. 37 which are the same as those of the test jig 200 shown in FIG. 27, FIG. 28, and the test jig 200C shown in FIG. 35 are given the same reference numerals.

In a test jig 200E shown in FIG. 37, the two wiring boards 220, 221 are layered, and the supporting member 215A is sandwiched between the two wiring boards 220, 221. Further, in this embodiment, an insulating member 223A is also provided between the wiring board 220 and the socket body 202.

In the test jig 200E, to electrically connect the wiring boards 220, 221 to each other, a tape-automated bonding (TAB) method is used. In further detail, on the wiring board 221 positioned in an upper side, a TAB lead 228 is provided to electrically connect with the wiring board 221. In addition, the TAB lead 228 is extended to the wiring board 220 positioned in a lower side, and is connected to the pull-out lines 219.

Since the TAB lead 228 can bend flexibly, from the wiring board 221 positioned in the upper side to the wiring board 220 positioned in the lower side, the TAB lead 228 may easily be extended. Therefore, the electrical connection of the wiring board 221 positioned in the upper side and the wiring board 220 positioned in the lower side may easily and positively be performed.

Figure 38:
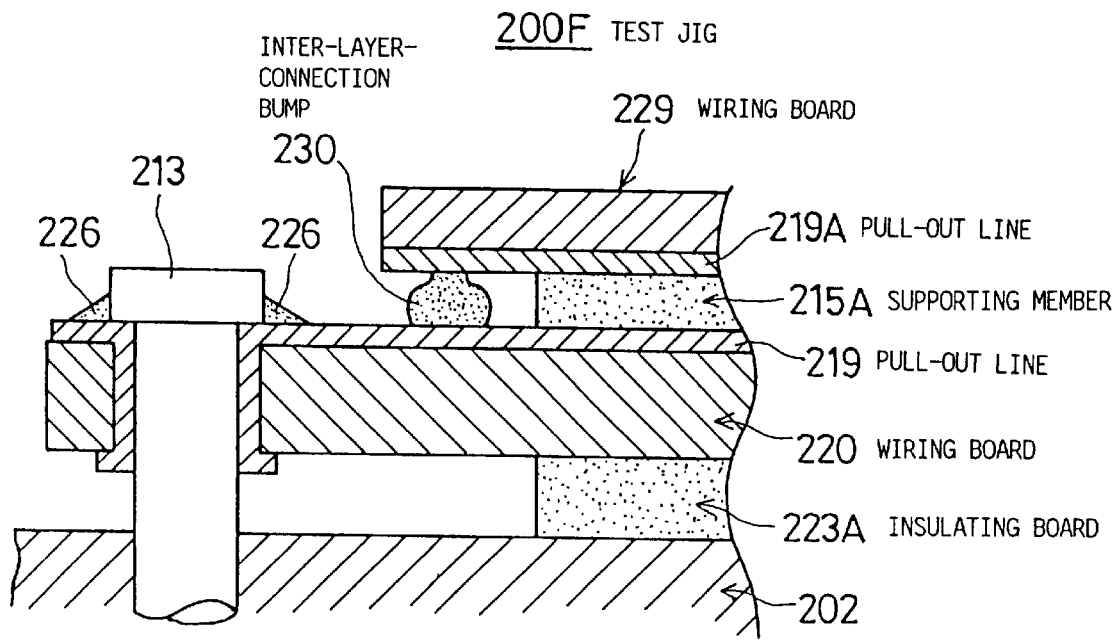
FIG. 38 shows a cross-sectional view of an eleventh embodiment of a test jig for a semiconductor device according to the present invention.

FIG. 38 shows a cross-sectional view of an eleventh embodiment of a test jig for a semiconductor device according to the present invention. Elements in FIG. 38 which are the same as those of the test jig 200E shown in FIG. 37 are given the same reference numerals.

In a test jig 200F shown in FIG. 38, on the wiring board 220, a wiring board 229 of a ceramic board is layered. Further, in a face of the wiring board 229 facing the wiring board 220, a pull-out line 219A is formed. The supporting member 215A is sandwiched between the wiring boards 220, 229. The insulating member 223A is provided between the wiring board 220 and the socket body 202.

In the test jig 200F, to electrically connect the wiring boards 220, 229 to each other, a bump method is used. In further detail, in a position of the pull-out line 219 formed in the wiring board 220 facing the wiring board 229, an inter-layer-connection bump 230 is formed. Through the inter-layer-connection bump 230, the pull-out line 219 formed in the wiring board 220 and the pull-out line 219A formed in the wiring board 229 are electrically connected.

Therefore, the wiring board 229 and the wiring board 220 can be connected to each other by using the same process as a face down bonding. Accordingly, the electrical connection of the wiring board 229 positioned in the upper side and the wiring board 220 positioned in the lower side may easily and positively be performed. Further, the wiring boards 229, 220 are connected to each other by using the inter-layer-connection bump 230, even if the number of the pull-out lines 219, 219A increases, the electrical connection between the wiring boards 229, 220 may be easily performed.

Figure 39:
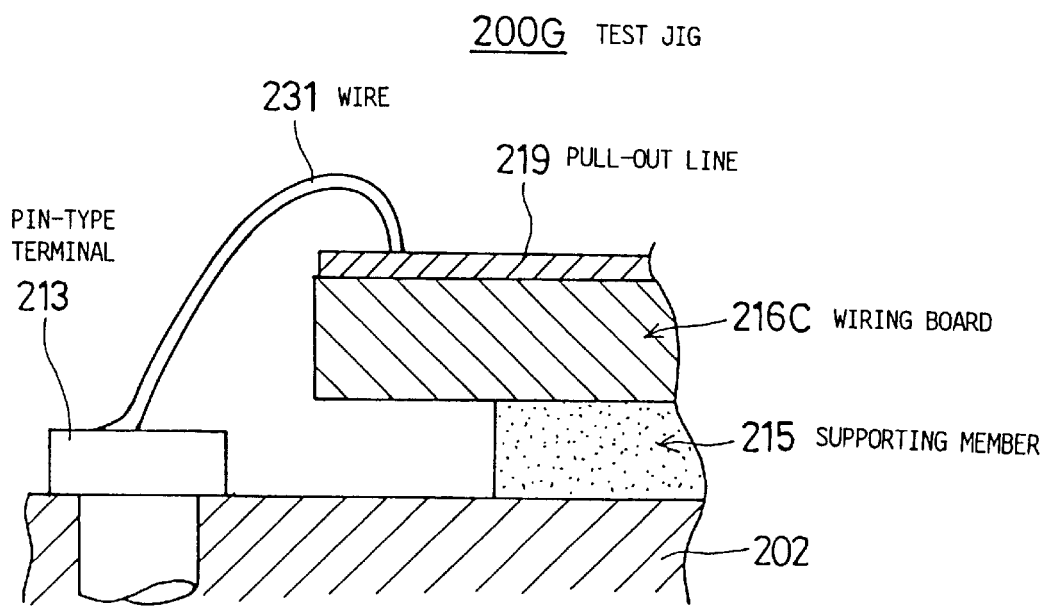
FIG. 39 shows a cross-sectional view of a twelfth embodiment of a test jig for a semiconductor device according to the present invention.

FIG. 39 shows a cross-sectional view of a twelfth embodiment of a test jig for a semiconductor device according to the present invention. In a test jig 200G shown in FIG. 39, by using a wire 231, the pull-out line 219 formed in the wiring board 216C is connected to the pin-type terminal 213.

According to the present embodiment, since the pull-out line 216 and the pin-type terminal 213 are connected to each other through the wire 231, a wire-bonding apparatus which is widely known as a semiconductor manufacturing technique can be used. Therefore, the connection of the pull-out line 219 and the pin-type terminal 213 may easily and efficiently be performed.

The present embodiment has shown the configuration in which the wiring board 216C having a single layer structure and the pin-type terminal 213 are connected to each other by using the wire 231. However, for example, in the configuration in which the plurality of wiring boards 220, 221 are layered as shown in the tenth embodiment of the test jig 200E in FIG. 30, if the wire 231 is used instead of the TAB lead 228, the layers may be connected to each other through the wire 231. Also in this case, the connection of the plurality of wiring boards 220, 221 may easily and efficiently be performed.

Figures 40A, 40B:
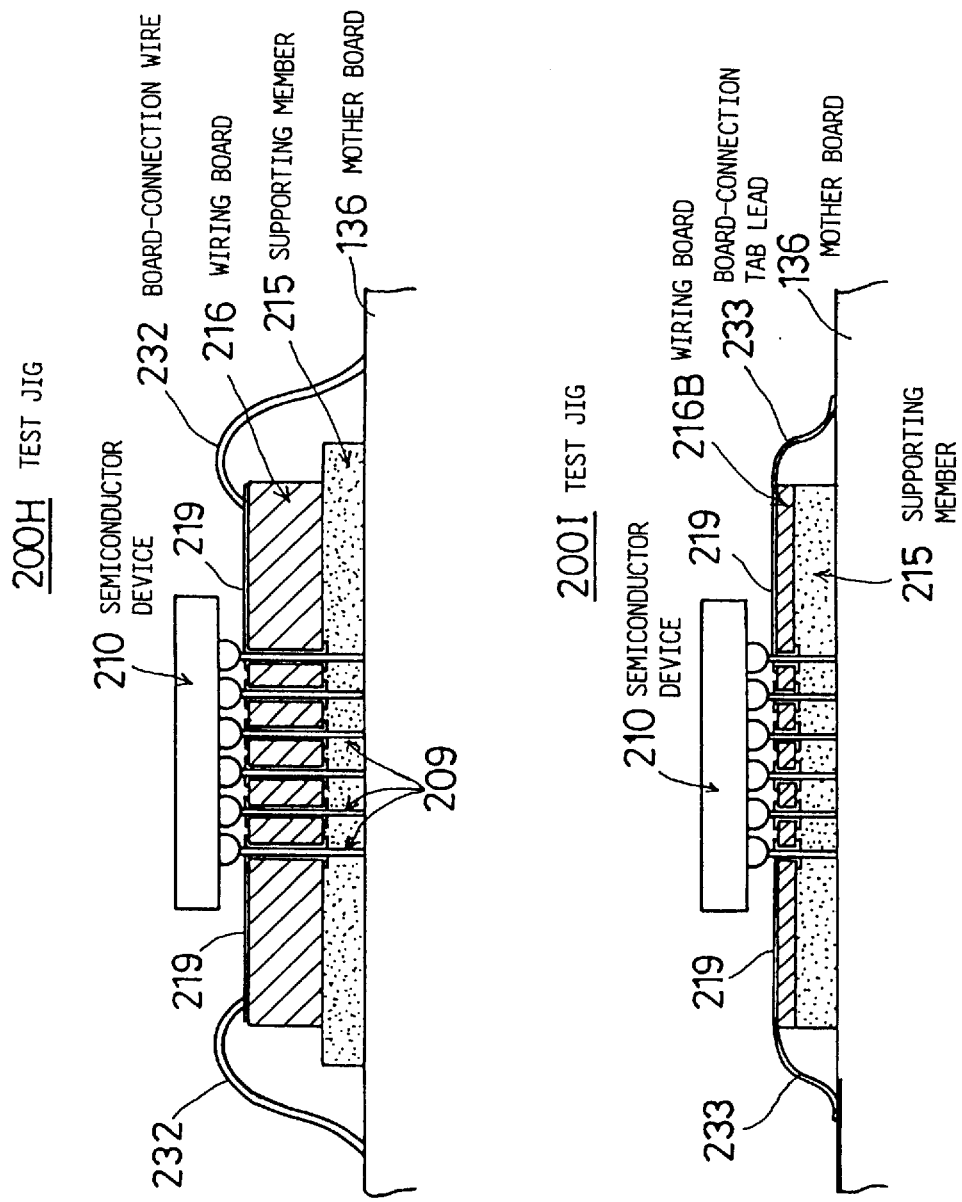
FIG. 40A and FIG. 40B show cross-sectional views of thirteenth embodiments of test jigs for a semiconductor device according to the present invention.

FIG. 40A and FIG. 40B show cross-sectional views of thirteenth embodiments of test jigs for a semiconductor device according to the present invention. Elements in FIG. 40A and FIG. 40B which are the same as those of the test jig 200 shown in FIG. 27 and FIG. 28 and the test jig 200B shown in FIG. 34 are given the same reference numerals.

In the previously-discussed test jigs 200, 200A to 200G, in the same way as the contact-probe device 120 shown in FIG. 16, the semiconductor device 210 is installed in the motherboard 136 in order to be tested. Namely, to the motherboard 136, the testing apparatus body 135 is connected, and the testing apparatus body 135 and the semiconductor device 210 are electrically connected through the motherboard 136 and one of the test jigs 200, 200A to 200G. In this way, the semiconductor device 210 is tested.

Therefore, one of the test jigs 200, 200A to 200G needs to be connected to the motherboard 136. In the previously-discussed embodiments, one of the test jigs 200, 200A to 200G is connected to the motherboard 136 by using the pin-type terminal 213.

On the contrary, in test jigs 200H and 200I according to the present embodiments, the test jigs 200H and 200I are directly provided on the motherboard 136. In particular, in the test jig 200H shown in FIG. 40A, the glass-epoxy board is used for the wiring board 216, and in the test jig 200I shown in FIG. 40B, the polyimide-film board is used for the wiring board 216B.

In the thirteenth embodiments, the test jigs 200H, 200I are directly mounted on the motherboard 136 without using the IC socket 210. Further, the test jig 200H and the motherboard 136 are connected to each other by using a board-connection wire 232 instead of the pin-type terminal 213, and the test jig 200I and the motherboard 136 are connected to each other by using a board-connection TAB lead 233 instead of the pin-type terminal 213.

As discussed above, according to the test jigs 200H, 200I, the wiring boards 216, 216B are directly and electrically connected to the motherboard 136. Therefore, for connecting the wiring boards 216, 216B with the motherboard 136, the constructions such as a pin-type terminal 213 are unnecessary. Accordingly, by the simple configuration and the simple connecting operation, the test jigs 200H, 200I and the motherboard 136 may be electrically connected.

In the embodiments shown in FIG. 40A and FIG. 40B, only the embodiment in which the glass-epoxy board is used for the wiring board 216 and the embodiment in which the polyimide-film board is used for the wiring board 216B are shown. However, for those embodiments, the wiring board 216A constructed with the ceramic board may be used to realize that configuration in which the wiring board 216A is directly and electrically connected to the motherboard 136.

Figure 41:
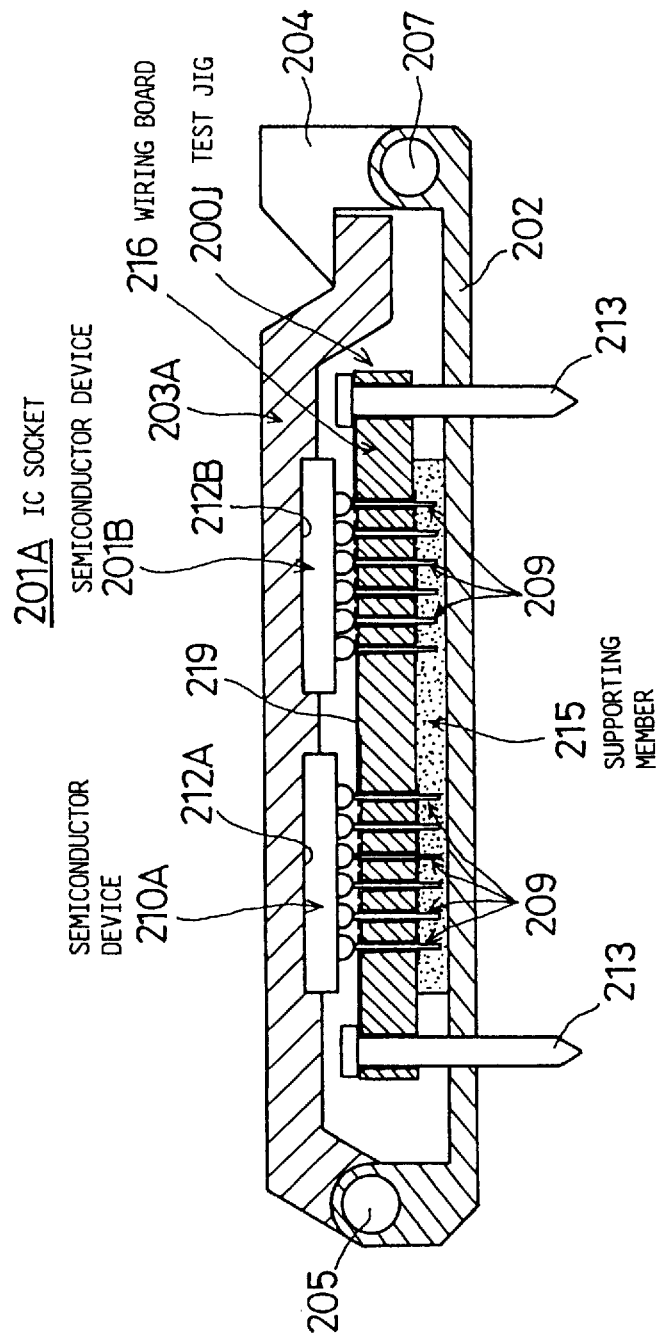
FIG. 41 shows a cross-sectional view of an IC socket using a fourteenth embodiment of a test jig for a semiconductor device according to the present invention.

FIG. 41 shows a cross-sectional view of an IC socket using a fourteenth embodiment of a test jig for a semiconductor device according to the present invention. Elements in FIG. 41 which are the same as those of the test jig 200 and the IC socket 201 shown in FIG. 27 are given the same reference numerals.

In a test jig 200J shown in FIG. 41, a plurality (two devices, in this case) of semiconductor devices 210A, 210B can be provided in order to be tested. Corresponding to the semiconductor devices 210A, 210B, in a lid part 203A of an IC socket 201A, two concave parts 212A, 212B for positioning the semiconductor devices 210A, 210B are formed.

As discussed above, according to the test jig 200J, the plurality of semiconductor devices 210A, 210B may simultaneously be provided. Therefore, the plurality of semiconductor devices 210A, 210B may be tested together, and, thus, efficiency of the testing operation may be improved.

Further, the present invention is not limited to these embodiments, but other variations and modifications may be made without departing from the scope of the present invention.

What is claimed is:

1. A method of testing a semiconductor device comprising the steps of:

providing a semiconductor device on which projection electrodes are formed and forming said projection electrodes of solder;

providing a test board having a main board and testing electrodes formed on said main board, wherein each testing electrode of said testing electrodes projects upwardly from said main board;

forming a plurality of wire bumps on said main board of said test board so that each wire bump of said plurality of wire bumps is formed to have a pedestal part with a bottom surface in contact with said main board of said test board and a projecting part which projects upwardly from said pedestal part for insertion into one of said projection electrodes and wherein a cross-sectional area of said projection part is less than a bottom area of said pedestal part;

using said test board under normal temperature so that no heating process is necessary;

mounting said semiconductor device on said main board of said test board by inserting said testing electrodes into said projection electrodes, wherein said testing electrodes are electrically connected to said projection electrodes and no impurities are mixed into said projection electrodes so that a highly accurate test may be performed;

testing said semiconductor device by using said testing electrodes connected to said projection electrodes;

separating said semiconductor device from said test board, wherein said test board easily separates from said semiconductor device by means of gently pulling said semiconductor device from said test board so that degradation of said projection electrodes is prevented; and shaping said projection electrodes by means of a wet-back process after said separating step has been accomplished so that said projection electrodes are properly shaped and voids generated within said projection electrode are completely removed.

2. The method as claimed in claim 1, further comprising inserting at least one wire bump into said projection electrodes during said mounting step.

* * * * *